(12) United States Patent
Palmer et al.

(10) Patent No.: US 10,254,654 B2
(45) Date of Patent: *Apr. 9, 2019

(54) MICROELECTROMECHANICAL MIRROR ASSEMBLY

(71) Applicant: NIKON CORPORATION, Tokyo (JP)

(72) Inventors: Shane R. Palmer, Oro Valley, AZ (US); Michael Binnard, Belmont, CA (US)

(73) Assignee: NIKON CORPORATION (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/844,086

(22) Filed: Dec. 15, 2017

(65) Prior Publication Data

US 2018/0107121 A1    Apr. 19, 2018

Related U.S. Application Data

(63) Continuation of application No. 14/469,397, filed on Aug. 26, 2014, now Pat. No. 9,874,817.
(Continued)

(51) Int. Cl.
*G03F 7/20* (2006.01)
*G02B 26/06* (2006.01)
(Continued)

(52) U.S. Cl.
CPC ......... *G03F 7/70058* (2013.01); *G02B 26/06* (2013.01); *G02B 26/0841* (2013.01);
(Continued)

(58) Field of Classification Search
CPC ............. G03F 7/70058; G03F 7/70075; G03F 7/70116; G02B 26/06; G02B 26/0833; G02B 26/0841; G02B 26/101
See application file for complete search history.

(56) References Cited

U.S. PATENT DOCUMENTS 5,539,567 A    7/1996    Lin et al.
5,539,568 A *  7/1996    Lin ........................ G02B 26/06
                                                    355/53

(Continued)

FOREIGN PATENT DOCUMENTS

EP        0810477  A2    12/1997

OTHER PUBLICATIONS

Hacker, et al. "Micromirror SLM for femtosecond pulse shaping in the UV", Appl. Phys. B, 76, pp. 711-714, Apr. 2003.
(Continued)

*Primary Examiner* — Steven Whitesell Gordon
(74) *Attorney, Agent, or Firm* — Roeder & Broder LLP; Steven G. Roeder

(57) ABSTRACT

An optical element assembly includes a base, and an element unit. The element unit includes (i) an optical element having an element central axis and an element perimeter; and (ii) an element connector assembly that couples the optical element to the base, the element connector assembly including a flexure assembly having an element flexure and a base flexure. A distal end of the element flexure is coupled to the optical element near the element perimeter, a distal end of the base flexure is coupled to the base, and a proximal end of the element flexure is coupled to a proximal end of the base flexure near the element central axis.

20 Claims, 16 Drawing Sheets

Related U.S. Application Data

(60) Provisional application No. 61/869,921, filed on Aug. 26, 2013.

(51) Int. Cl.
*G02B 26/08* (2006.01)
*G02B 26/10* (2006.01)

(52) U.S. Cl.
CPC ....... *G02B 26/101* (2013.01); *G03F 7/70075* (2013.01); *G03F 7/70116* (2013.01)

(56) References Cited

U.S. PATENT DOCUMENTS

| | | | |
|---|---|---|---|
| 6,025,951 A | 2/2000 | Swart | |
| 6,220,561 B1 | 4/2001 | Garcia | |
| 6,384,952 B1 | 5/2002 | Clark et al. | |
| 6,724,125 B2 * | 4/2004 | Hung | G02B 6/2931 310/309 |
| 6,785,039 B2 | 8/2004 | Wendland, Jr. | |
| 7,002,730 B2 | 2/2006 | Ishiyuza et al. | |
| 2004/0114259 A1 | 6/2004 | Ishizuya | |
| 2005/0231792 A1 | 10/2005 | Alain | |
| 2007/0188847 A1 | 8/2007 | McDonald | |
| 2014/0049850 A1 | 2/2014 | Gil | |

OTHER PUBLICATIONS

Stewart, et al., "Design and development of a 331 segment-tip-tilt-piston mirror array for space-based adaptive optics", Sensors and Actuators A 138, pp. 230-238, May 2007.

Tsai, et al., "Gimbal-Less MEMS Two-Axis Optical Scanner Array with High Fill-Factor", Journal of Microelectromechanical Systems, vol. 14, No. 6, Dec. 2005.

Tuantranount, et al., "Phase-only micromirror array fabricated by standard CMOS process", Sensors and Actuators A 89, pp. 124-134, 2001.

Chen, et al., "A novel two-axis MEMS scanning mirror with a PZT actuator for laser scanning projection", Optics Express, vol. 20, No. 24, Nov. 15, 2012.

\* cited by examiner

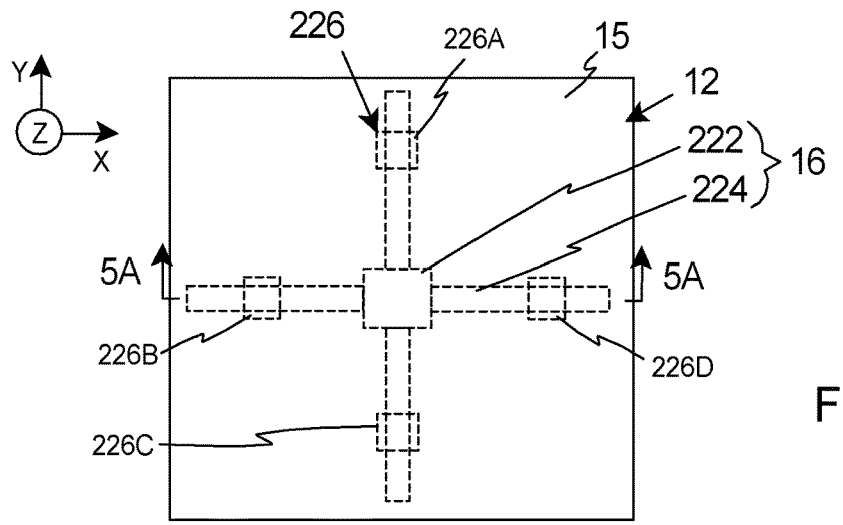
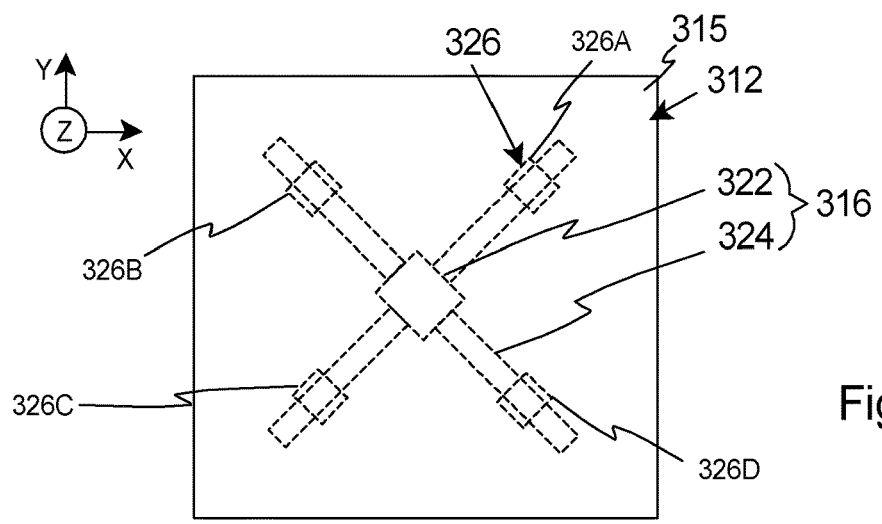
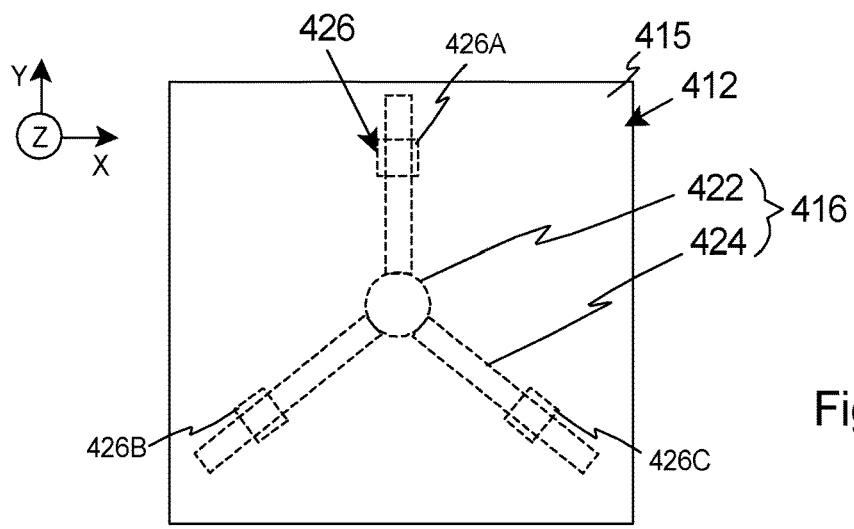

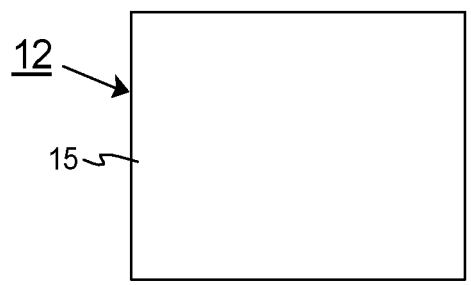
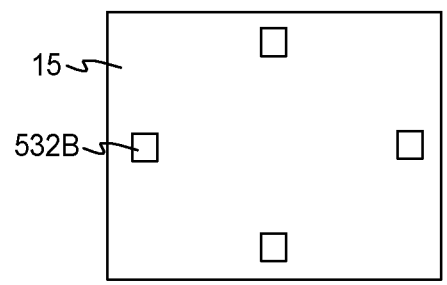
Fig. 7A  Fig. 7B
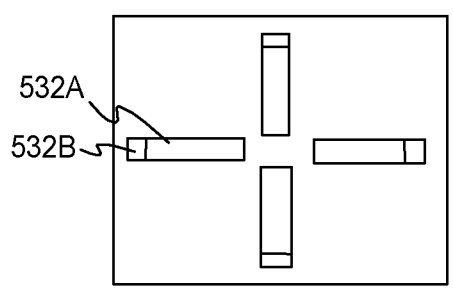
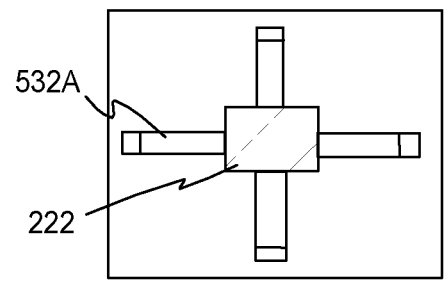
Fig. 7C  Fig. 7D
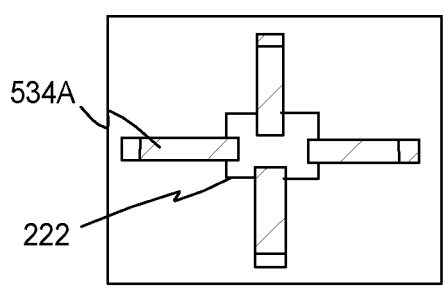
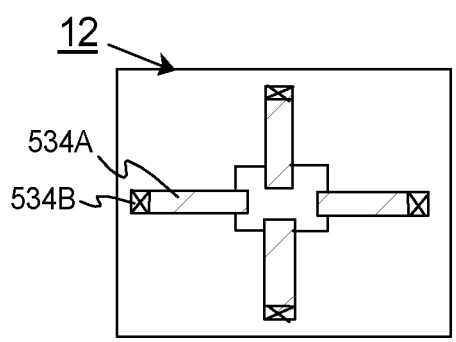
Fig. 7E  Fig. 7F

| electrode 928A | electrode 928B | electrode 990A | element 915 | A1 & A2 Part 990B | Optical Phase |
|---|---|---|---|---|---|
| + | + | + | Up | Up | 0 |
| − | + | + | Down | Up | Pi/3 |
| − | − | + | Up | Down | 2*Pi/3 |
| + | − | + | Down | Down | Pi |

Fig. 9G

MICROELECTROMECHANICAL MIRROR ASSEMBLY

CROSS-REFERENCE TO RELATED APPLICATIONS

The present application is a continuation application and claims the benefit under 35 U.S.C. 120 on co-pending U.S. patent application Ser. No. 14/469,397, filed on Aug. 26, 2014. Additionally, U.S. patent application Ser. No. 14/469,397 claims priority on U.S. Provisional Application Ser. No. 61/869,921 filed on Aug. 26, 2013 and entitled "MICROELECTROMECHANICAL MIRROR ASSEMBLY". As far as is permitted, the entire contents as disclosed in U.S. patent application Ser. No. 14/485,685 and U.S. Provisional Application Ser. No. 61/869,921 are incorporated herein by reference.

BACKGROUND

Microelectromechanical ("MEMS") mirror assemblies are used in many applications to shape and/or steer one or more beams. These MEMS mirror assemblies include a plurality of individually controllable micromirrors.

Unfortunately, existing MEMS mirror assemblies are not easily scaled to smaller dimensions due to net increase in "hinge spring forces" per mirror area. This necessitates a large increase to the external forces required to move the mirrors leading to additional stress and strains with reduced control and micromirror distortion and deformation during movement.

SUMMARY

The present invention is directed to an optical element assembly for adjusting the characteristics of a beam. The optical element assembly can include a base, and one or more element units. In one embodiment, one or more of the element units include (i) an optical element having an element central axis and an element perimeter; and (ii) an element connector assembly that couples the optical element to the base, the element connector assembly including a first flexure assembly having an element flexure and a base flexure. In certain embodiments, a distal end of the element flexure is coupled to the optical element near the element perimeter, a distal end of the base flexure is coupled to the base, and a proximal end of the element flexure is coupled to a proximal end of the base flexure near the element central axis.

Additionally, one or more of the element units can include a unit mover that moves the optical element relative to the base between a first position and a second position. Further, the element connector assembly can be positioned directly between the optical element and the base.

In certain embodiments, one or more of the element units include a central joiner that couples the distal end of the element flexure to the distal end of the base flexure. Further, the element connector assembly can include a second flexure assembly, and a third flexure assembly, and the flexure assemblies are spaced apart and extend radially away from near the element central axis. In this embodiment, the element connector assembly can couple the element to the base in a kinematic fashion.

Additionally, the element connector assembly can include a first stop that inhibits further movement of the element in a first direction when the element is at the first position, and a spaced apart second stop that inhibits further movement of the element in a second direction when the element is at the second position.

The present invention is also directed to a method for adjusting the characteristics of a beam, a method for manufacturing a substrate, and an exposure apparatus.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 2 is a top plan view of an optical element, and an element connector assembly from FIG. 1;

FIG. 3 is a top plan view of the optical element, and another embodiment of the element connector assembly;

FIG. 4 is a top plan view of the optical element, and yet another embodiment of the element connector assembly;

FIGS. 7A-7F are simplified illustrations of non-exclusive examples of one element unit at various stages of manufacturing;

FIG. 9G is a table that illustrates the control of the element unit of FIGS. 9A-9E.

DESCRIPTION

Figure 1:
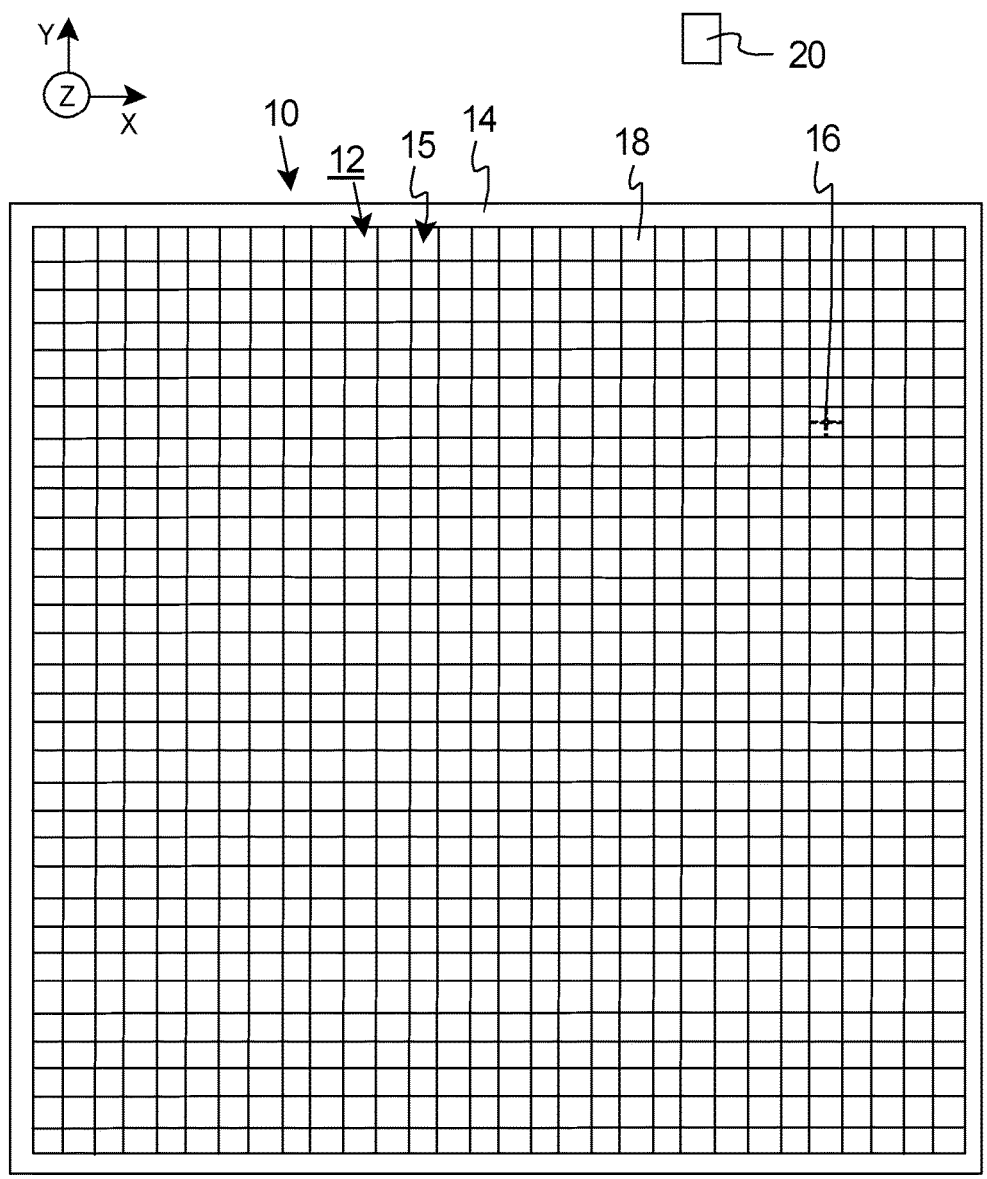
FIG. 1 is directed to a simplified top view of an optical element assembly having features of the present invention.

FIG. 1 is a schematic top illustration of an optical element assembly 10 that can be used to shape or steer a beam (not shown). The optical element assembly 10 can include a plurality of individual element units 12 and a base 14 that retains the element units 12. The size, shape, and orientation of these components can be varied pursuant to the teachings provided herein. In one embodiment, the optical element assembly 10 is a MEMS mirror assembly, and each of the element units 12 includes a reflective optical element 15 (e.g. micromirror) that is individually and selectively movable relative to the base 14 to adjust the characteristics of the beam (e.g. to reflect, shape or steer the beam).

As an overview, in certain embodiments, each optical unit 12 includes a unique element connector assembly 16 (only one is illustrated in phantom in FIG. 1) that connects and couples the optical element 15 to the base 14, and that allows for movement of the respective optical element 15 with reduced distortion of the reflective surface of the optical element 15, reduced stiction, and reduced surface reflection noise. Further, with the present design, the optical element assembly 10 is readily scalable and compact.

A number of Figures include an orientation system that illustrates an X axis, a Y axis that is orthogonal to the X axis, and a Z axis that is orthogonal to the X and Y axes. It should be noted that any of these axes can also be referred to as the first, second, and/or third axes.

The number of element units 12 in the element assembly 10 can be varied to achieve the desired resolution of the beam shaping or steering. As alternative, non-exclusive examples, the element assembly 10 can include one hundred (100), one thousand (1000), ten thousand (10,000), one hundred thousand (100,000), one million (1,000,000), or ten million (Ser. No. 10/000,000) individually controllable element units 12. Alternatively, the optical element assembly 10 can include more or fewer element units 12 than these examples. Further, in FIG. 1, the optical elements 15 are arranged in a generally square array. Alternatively, the optical elements can be arranged in a generally rectangular or circular shape.

The design of each optical element 15 can also be varied to achieve the desired resolution of the beam shaping or steering. In FIG. 1, each optical element 15 is square shaped. As alternative, non-exclusive examples, each element 15 is a micromirror and can include a square shaped, reflective, outer surface 18 that is 0.5 by 0.5 microns, 1 by 1 microns, 2 by 2 microns, 5 by 5 microns, or 10 by 10 microns. As alternative, non-exclusive examples, each element 15 can include a polygonal shaped outer surface 18, such as a rectangular shaped, triangular shaped, or hexagonal shaped, and so on, reflective, outer surface 18. Still, alternatively, other sizes and/or shapes can be used.

It should be noted that any of these element units 12 can be referred to as a first element unit, a second element unit, a third element unit, or a fourth element unit, etc. for convenience. Similarly, any of the optical elements 15 can be referred to as a first optical element, a second optical element, a third optical element, or a fourth optical element, etc. for convenience.

The optical elements 15 are slightly spaced apart a gap to allow for individual movement of the optical elements 15. This gap is not illustrated in simplified FIG. 1. As non-exclusive examples, a gap of approximately twenty, fifty, one hundred, or five hundred microns can separate adjacent optical elements 15. However, other gaps are possible. Typically, the gap is as small as possible to get good fill.

In one embodiment, each optical element 15 is rigid. Suitable materials for each optical element 15 can include TiAl alloy, aluminum, copper, or composite materials formed by alternately layering metal layers and layers of oxide, nitrige, carbides or the like. Each optical element 15 can include a high reflective metallic coating such as chrome, aluminum, gold, etcetera, or other metals with the addition of multi-layer coatings to increase reflectivity at lower wavelengths. However, other materials can be utilized.

In one embodiment, the reflective outer surface 18 is generally flat, and can be polished and/or coated with one or more thin layers of material that collectively create a reflective surface at the wavelength of the beam. Thus, the type of material utilized for the layers of reflective material will depend upon the wavelength of the beam. For example, suitable layers include molybdenum/silicon for wavelengths of approximately 13 nm, molybdenum/beryllium for wavelengths of approximately 11 nm, and aluminum for wavelength approximately 193 nm. However, other materials may be utilized.

In FIG. 1, the base 14 is rigid, square shaped, and supports the optical elements 15. In this embodiment, the base 14 is larger than the array of optical elements 15. Alternatively, the base 14 can have another shape, e.g. rectangular or circular shaped. As a non-exclusive example, the base 14 can be made of a silicon substrate.

Additionally, the optical element assembly 10 can include a control system 20 (illustrated as a box) that is electrically connected to and directs current to a separate unit mover assembly 226 (shown in FIG. 2) for each element unit 12 to individually position each of the elements 15 relative to the base 14. The control system 20 can include one or more processors and software to perform the functions provided herein.

FIG. 2 is a top plan view of one of the element units 12 including the optical element 15 and its corresponding element connector assembly 16 from FIG. 1. One or more of the element units 12 illustrated in FIG. 1 can be designed similar to that illustrated in FIG. 2.

In FIG. 2, the element connector assembly 16 includes a joiner 222 (sometimes referred to as a "hub"), and a plurality of flexure assemblies 224. More specifically, in this embodiment, the hub 222 is centrally located and is generally square shaped. Alternatively, the hub 222 can have another shape, such as a circular shaped cross-section, an octagon shaped cross-section, or tubular shaped. Further, in FIG. 2, the element connector assembly 16 includes four flexure assemblies 224 that extend radially from the hub 222 at ninety degrees intervals. Alternatively, the element connector assembly 16 can include more than four or fewer than four flexure assemblies 224.

It should be noted that any of the flexure assemblies 224 can be referred to as a first flexure assembly, a second flexure assembly, a third flexure assembly, or a fourth flexure assembly, etc. for convenience.

Additionally, each element unit 12 can include a separate unit mover assembly 226 (illustrated in phantom) for individually moving its corresponding optical element 15. Each separate unit mover assembly 226 can be individually controlled by the control system 20 (illustrated in FIG. 1). In one embodiment, the unit mover assembly 226 includes four separate and spaced apart movers 226A, 226B, 226C, 226D. In this embodiment, each mover 226A, 226B, 226C, 226D is positioned near one of the flexure assemblies 224. It should be noted that any of the movers 226A, 226B, 226C, 226D can be referred to as a first mover, a second mover, a third mover, or a fourth mover, etc. for convenience.

Alternatively, the unit mover assembly 226 can be designed to include more than four or fewer than four movers.

FIG. 3 is a top plan view of an alternative embodiment of the element unit 312 including the optical element 315, the element connector assembly 316, and the unit mover assembly 326. In this embodiment, the joiner 322, the plurality of flexure assemblies 324, and the movers 326A, 326B, 326C, 326D of the unit mover assembly 326 are moved forty-five degrees from the embodiment illustrated in FIG. 2. This design will allow for longer flexure assemblies 324 while still being completely positioned directly between the respective optical element 315 and the base 14 (illustrated in FIG. 1).

FIG. 4 is a top plan view of yet another alternative embodiment of the element unit 412 including the optical element 415, the element connector assembly 416, and the unit mover assembly 426. In this embodiment, the element connector assembly 416 includes the joiner 422 and the plurality of flexure assemblies 424 that are similar to the corresponding components described above and illustrated in FIG. 2. However, in this embodiment, the joiner 422 has a circular shaped cross-section, and there are only three flexure assemblies 424 that extend away from the hub 422 at intervals of one hundred and twenty degrees.

Moreover, in this embodiment, the unit mover assembly 426 includes three separate and spaced apart movers 426A, 426B, 426C, with each mover 426A, 426B, 426C being positioned near one of the flexure assemblies 424.

With the arrangement illustrated in the FIG. 4, the flexure assemblies 424 support the optical element 415 in a kinematic fashion, and the unit mover assembly 426 moves the optical element 415 in a kinematic fashion. This allows for better height, pitch, and roll control of the optical element 415 for better control of the characteristics of the beam (e.g. better control of the optical phase).

Further, it should be noted that for the embodiments provided herein, one or more individual unit movers 226, 326, 426 of each element unit 12, 312, 412 can be individually controlled to move the optical element 15, 315, 415 relative to the base 14 (illustrated in FIG. 1) (i) up and down along the Z axis (to change the phase of the beam), (ii) tilting about the X axis, and/or (iii) tilting about the Y axis.

Figure 5A:
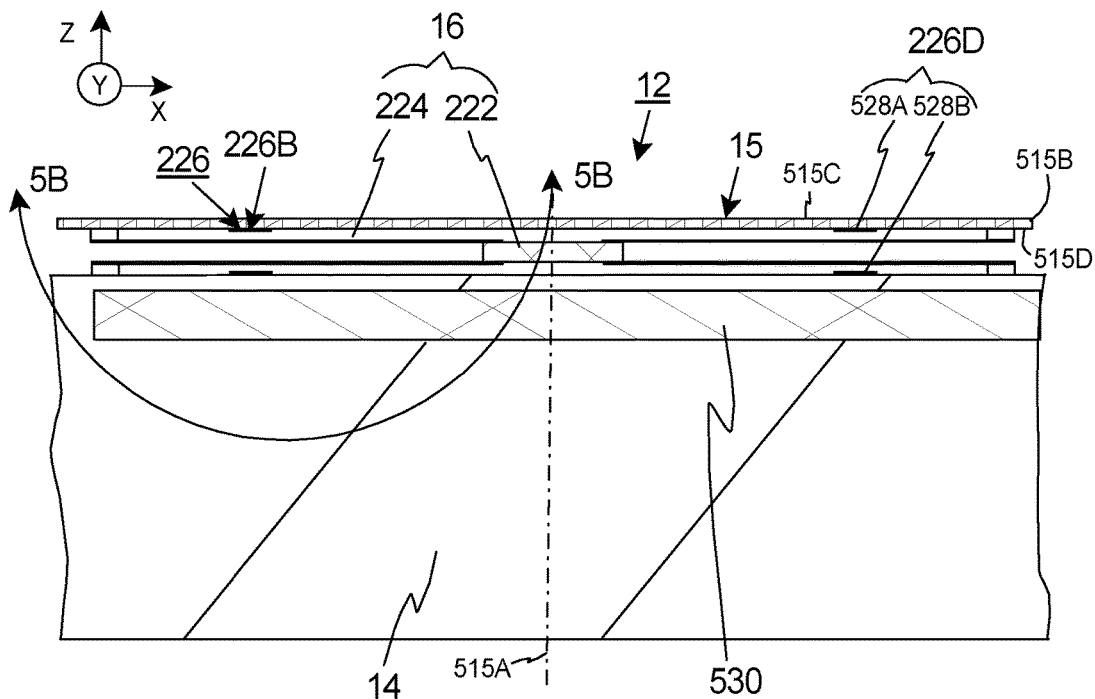
FIG. 5A is a cut-away view taken on line 5A-5A in FIG. 2.

FIG. 5A is a cut-away view of the taken on line 5A-5A in FIG. 2 that illustrates a portion of the base 14, and one element unit 12 with (i) the optical element 15, (ii) the element connector assembly 16 including the joiner 222, and two of the flexure assemblies 224; and (ii) the movers 226B, 226D of the unit mover assembly 226. It should be noted that in this embodiment, the element connector assembly 16 also includes two more flexure assemblies 224 that are not shown in FIG. 5A.

As provided above, the unit mover assembly 226 can be used to move each individual element 15 (e.g. up and down or tilted). In this embodiment, (as described above in reference to FIG. 2) for each element 15, the unit mover assembly 226 includes four movers 226B, 226D (only two are illustrated, and one near each flexure assembly 224). Further, each of the movers 226B, 226D includes a first electrode 528A (also sometimes referred to as an "element electrode") that is secured to the element 15, and a second electrode 528B (also sometimes referred to as a "base electrode") that is secured to the base 14.

With the design illustrated in FIG. 5A, current can be directed to the electrode pairs 528A, 528B to move the respective element 15. For example, the control system 20 (illustrated in FIG. 1) can direct current to the electrode pairs 528A, 528B to attract the electrode pairs 528A, 528B and move the element 15 towards the base 14. In one embodiment, complementary metal-oxide-semiconductor ("CMOS") address circuitry 530 has been embedded into base 14 for use in the unit mover assembly 226.

With the designs provided herein, each element 15 can be accurately and reliably moved to effect a phase change. In one non-exclusive example, approximately 0.8 nanometers of movement of the element 15 is needed to effect the phase change.

It should be noted that in this embodiment, for each element unit 12, its respective element connector assembly 16 and unit mover assembly 226 are entirely positioned directly between the element 15 and the base 14. This will allow the adjacent elements 15 to be positioned in close proximity to each other.

FIG. 5A also illustrates that the element 15 has an element central axis 515A, an element outer perimeter 515B, an upper surface 515C that faces away from the base 14, and a lower surface 515D that faces the base 14. Further, in this embodiment, the joiner 222 is centrally located coaxial with the element central axis 515A. Moreover, the element connector assembly 16 is positioned directly and fully between the optical element 15 and the base 14. Additionally, in this embodiment, all four flexure assemblies 224 are secured to the central joiner 222, and all four flexure assemblies 224 are spaced apart and extend radially away from near the element central axis 515A.

Figure 5B:
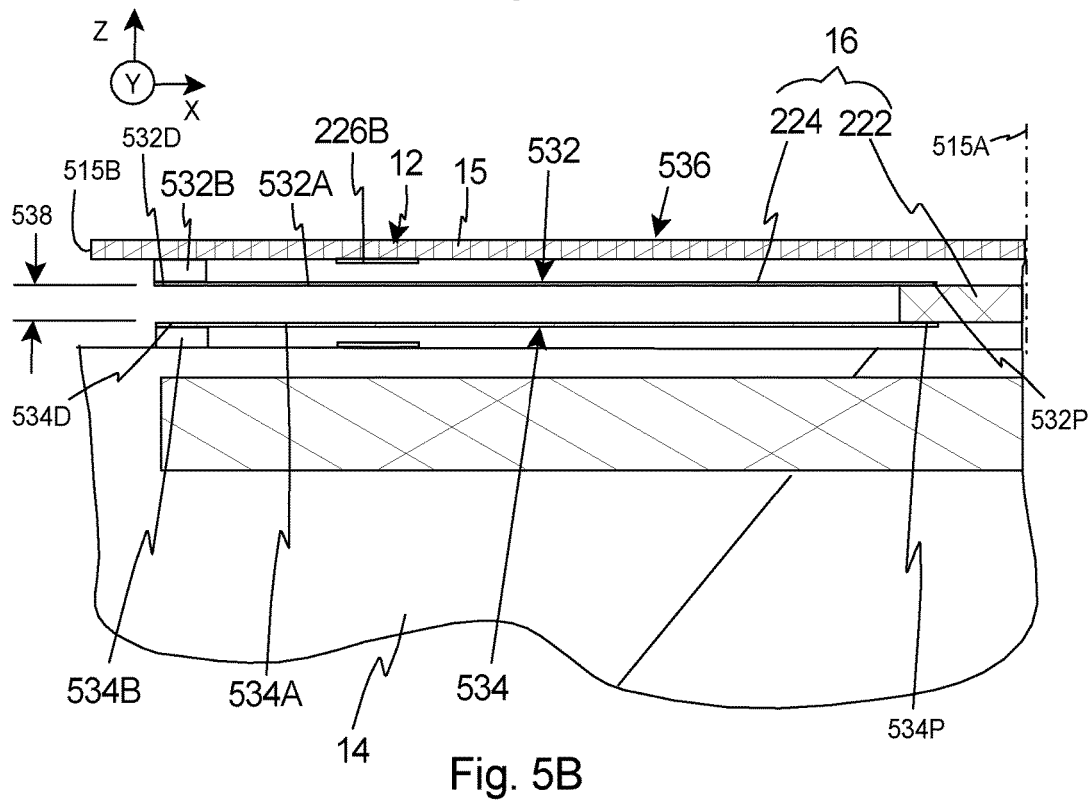
FIG. 5B is an enlarged cut-away view taken from FIG. 5A with the element in a first position.

FIG. 5B is an enlarged cut taken from FIG. 5A on line 5B-5B which illustrates a portion of the element unit 12, including a portion of the element 15, a portion of the joiner 222, one of the flexure assemblies 224 of the element connector assembly 16, and one of the movers 226B.

In this embodiment, the flexure assembly 224 includes (i) a first flexure 532 (also sometimes referred to as an "element flexure") that extends between the bottom of the element 15 (near the outer perimeter 515B of the element 15 in this embodiment) and the top of the joiner 222 (near the element central axis 515A), and (ii) a second flexure 534 (also sometimes referred to as a "base flexure") that extends between the top of the base 14 (near the outer perimeter 515B of the element 15) and the bottom of the joiner 222 (near the element central axis 515A). In this embodiment, the central joiner 222 is centered on the element central axis 515A, and the central joiner 222 couples the distal end of the element flexure 532 to the distal end of the base flexure 534. In one embodiment, the flexures 532, 534 are approximately parallel to each other (extend substantially parallel to each other) and aligned vertically when the element 15 is in a first position 536 (e.g. a relaxed position) illustrated in FIG. 5B. With this design, each flexure assembly 224 has a balanced double flexure 532, 534 arrangement.

Additionally, in this embodiment, the first flexure 532 includes (i) a generally straight, flexible first beam 532A that extends radially outward from the joiner 222 from near the element central axis 515A, the flexible first beam 532A having a proximal end 532P that is attached to the joiner 222, and a distal end 532D that cantilevers away from the joiner 222; and (ii) a first connector 532B (rectangular or other shape) (also referred to as a contact pad) that attaches the distal end 532D of the first beam 532A to the element 12 near and within the element perimeter 515B. Somewhat similarly, the second flexure 534 includes (i) a generally straight, flexible second beam 534A that extends radially outward from the joiner 222 from near the element central axis 515A, the flexible second beam 534A having a proximal end 534P that is attached to the joiner 222, and a distal end 534D that cantilevers away from the joiner 222; and (ii) a second connector 534B (rectangular or other shape) that attaches the distal end 534D of the second beam 534A to the base 14. In this embodiment, a proximal end 532P, 534P of each beam 532A, 534A are coupled together near the element central axis 515A with the joiner 222.

Figure 5C:
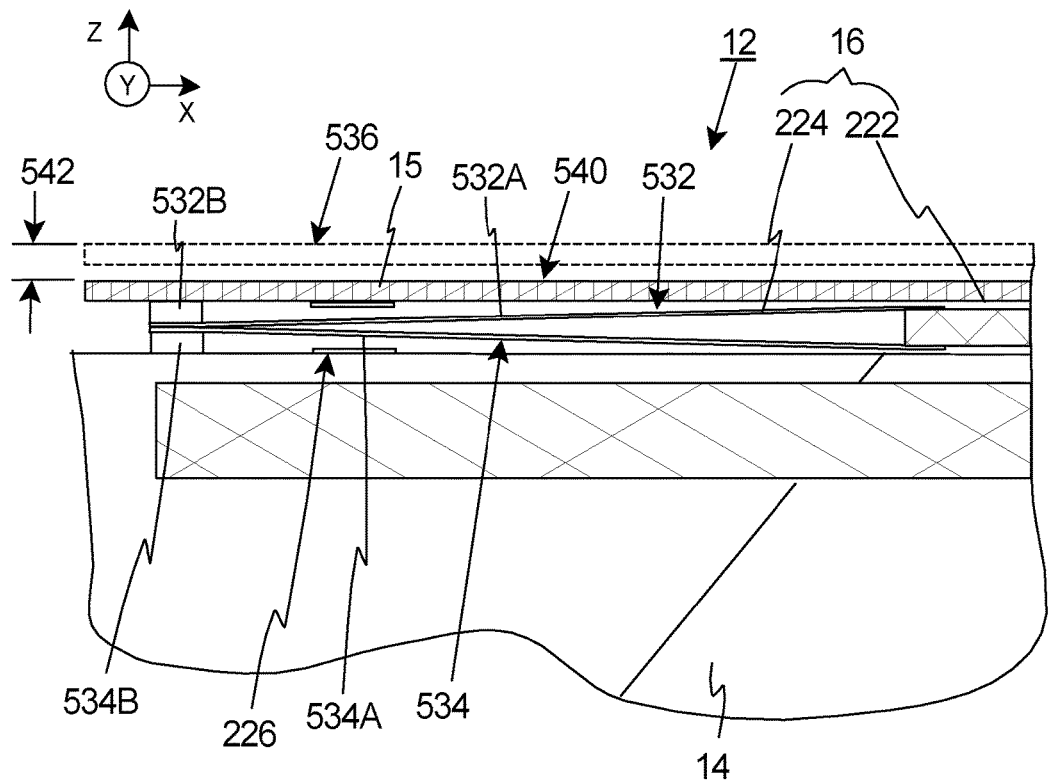
FIG. 5C is an enlarged view with the element in a second position.

The joiner 222 has a thickness 538, and in certain embodiments, this thickness 538 determines the amount of motion in the second stop or pull-down second position 540 (illustrated in FIG. 5C). In certain embodiments, a typical Semiconductor (SC) deposition process can be used to manufacture the joiner 222 to nanometer accuracy. In the first position 536 (original relaxed position), the flexures 532, 534 can be designed to compensate for the effect of gravity.

FIG. 5C is an enlarged view with the element 15 of the element unit 12 in a second position 540, and the element 15 in phantom at the first position 536. In this embodiment, the unit mover assembly 226 can be controlled to precisely and selectively move the element 15 between the positions 536, 540 relative to the base 14.

It should be noted that in the second position 540, the element 15 has moved a movement distance 542 from the first position 536 that is approximately equal to the thickness 538 (illustrated in FIG. 5D) of the joiner 222. Further, in this position, the distal ends of the first flexure 532A and the second flexure 534A have been bent towards each other until they contact near the respective connector 532B, 534B. In one example, a 180 degree change to a 193 nanometer beam requires a movement distance 542 of approximately 48.25 nanometers (λ wavelength of beam divided by four).

It should be noted that with this design, there is very little contact area between the flexures 532, 534 (only distal ends contact each other) when the element 15 is in the second position 540, and the element 15 does not contact the base 14. As a result thereof, there is very little stiction and very little distortion of the element 15. Further, in certain embodiments with the double flexure 532, 534 design, the distal ends of the flexures 532, 534 function as built in stops.

Further, the double flexure 532, 534 design reduces the stress on the element 15 and avoids distortion of the flat element surface. Vertical motion of the element 15 is assured without rotation or torsion by the multiple flexure assemblies 224.

Figure 5D:
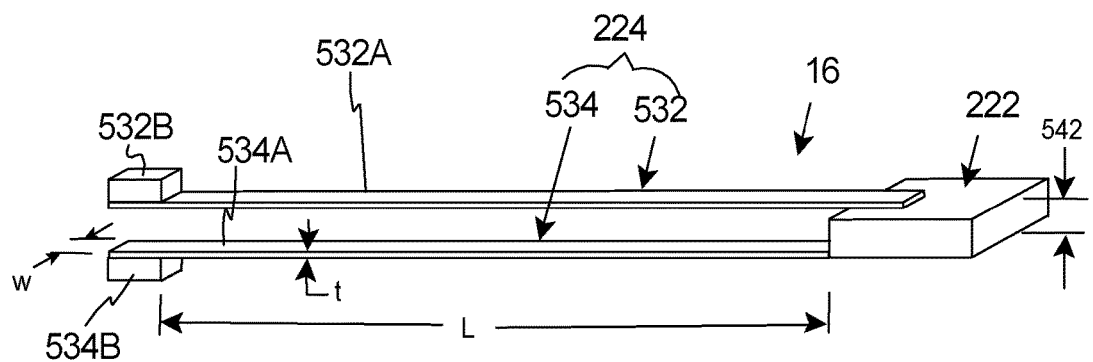
FIG. 5D is a simplified perspective view of a joiner, a first flexure and a second flexure having features of the present invention.

FIG. 5D is a simplified perspective view of the joiner 222; and one of the flexure assemblies 224 including the first flexure 532 having the first beam 532A and the first connector 532B; and the second flexure 534 having the second beam 534A and the second connector 534B. It should be noted that the other flexure assemblies 224 are not illustrated in FIG. 5D for clarity. Additionally, it should be noted that with the present invention, the flexing, stiffness, and damping characteristics of the flexure assembly 224 can be varied and tuned by adjusting the length (L), width (w), thickness (t), and the materials of the flexures 532, 534. Further, as provided above with reference to FIGS. 5C and 5D, the movement distance 542 from the first position 536 to the second position 540 can be approximately equal to the thickness 538 of the joiner 222.

Figure 5E:
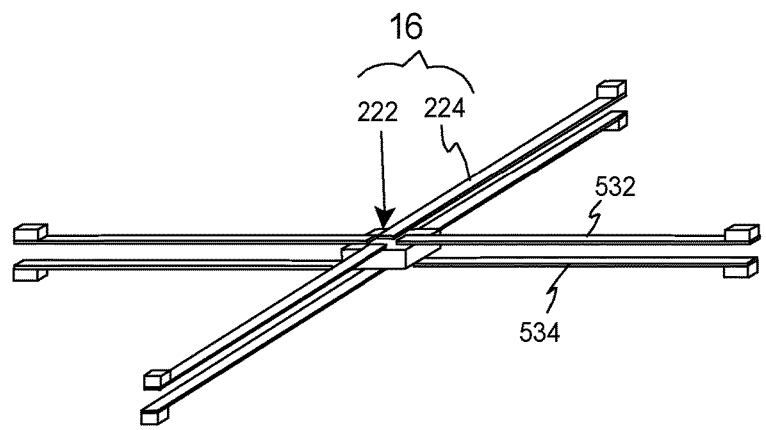
FIG. 5E is a simplified perspective view of an element connector assembly having features of the present invention.

FIG. 5E is a simplified perspective view of the element connector assembly 16 including the joiner 222 and the four flexure assemblies 224 that cantilever radially from the joiner 222.

In one embodiment, the element connector assembly 16 can be made as a unitary structure. For example, the element connector assembly 16 can be made by depositing (or grown) on the base in a three step full semiconductor manufacturable process.

As provided herein, the two state, element connector assembly 16 has limited physical contact, thus avoiding stiction issues. In certain embodiments, the element connector assembly 16 is created independently from the element 15. As a result thereof, the design parameters such as thickness, length, etc., can be adjusted providing larger latitude for element array scaling. Referring to FIGS. 5C and 5D, only one critical feature process step is required, namely the metal deposition (or other material) of the joiner 222 (separation post) between the two flexure beams 532A, 534A. For this device, the normal state (first position 536) is up at (called) 0° phase. The element down position 540 or 180 degree reflection is performed by activating the unit mover assembly 226.

The pull-down method of the mirror 15 is compatible with either electrostatic or magnetic methods. The double-arm 532, 534 relieves stress on the mirror 15 and avoids distortion of the flat surface. The separation of the flexure arm 532, 534 from the mirror 15 allows scalability flexure arms 532, 534 with mirror 15 size to compensate for required pull down voltage against flexure 532, 534. The vertical motion is assured without rotation or torsion by the four symmetric double-flexure armatures.

As provided herein, the unique designs of the element units 12 disclosed herein are very scaleable. In one embodiment, the force on the mirror 15 from an electric field created below the mirror 15 generated by the unit mover assembly 226 follows from the force between two parallel plates which is:

$$F_e = 0.5\varepsilon_o E^2 A, \qquad \text{Equation (1)}$$

where A is the area of the mirror 15, and E is the electric field value (epsilon is the free space dielectric constant). However, in terms of an applied voltage between two plates, this can be written as follows (setting the bottom of the mirror to be at z=0 and upward positive):

$$F_e = 0.5\varepsilon_o A[V/(d-z)]^2 \qquad \text{Equation (2)}$$

where V is the voltage applied between the mirror and the bottom surface, and d is the distance between the base and the mirror. The restoring mechanical force by the flexures 532, 534 (act as a spring) follows Hooke's law, i.e.

$$F_r = -k(z) \qquad \text{Equation (3)}$$

with k being the spring constant and (d−z) is the distance from the equilibrium position at d. Balancing the electrical force in (2) with a restoring mechanical force by the flexure 532, 534 (which acts as a spring), e.g. setting the forces equal $F_e = F_r$, and solving for V we get:

$$V(z) = [(2k)/(\varepsilon_o A)]^{1/2}(d-z)^{3/2}. \qquad \text{Equation (4)}$$

Now k, the restoring force constant of a single flexure beam 532, 534 can be solved using the cantilever equation (see Roark's Formulas for Stress and Strain, 6$^{th}$ Ed, Warren Young, McGraw Hill, 1989, p. 100) which is approximated as:

$$k = [(Ywt^3/4L^3)] \qquad \text{Equation (5)}$$

where: Y is modulus of elasticity for the beam 532, 534; w is the width of the beam 532, 534; t is the thickness of the beam 532, 534; L is the length of the cantilever (there are eight flexures 532, 534 in the example illustrated in FIG. 5E).

For a first approximation of the voltage required to hold the mirror element 15 at a position z against the restoring force we set the electrical force equal to the restoring force, i.e., $F_e = F_r$, and solve for V. Note also, since there are eight flexures 532, 534 per mirror 15, then equation 4 becomes $V = 4 \ (\varepsilon_o A)^{-1/2}(d-z)^{3/2}k^{1/2}$, then:

$$V=4(\varepsilon_o A)^{-1/2}(d-z)^{3/2}[(Ywt^3)/(4L^3)]^{1/2} \quad \text{Equation (6)}$$

Note L, t and w in the above equation 6. The length of the beam 532, 534 scales with the size of the MEMs mirror dimension and mechanical force increases as the mirror 15 size decreases. Meanwhile, the electrical force decreases proportionally by the mirror 15 size. What this entails is that the voltage required to pull a smaller mirror 15 down against the mechanical restoring force of the cantilever (that is not adjusted) grows as the −5/2 power of the mirror 15 size, i.e. approximate the size of the mirror 15 as 2 L. So changing from a five micron wide mirror 15 to a one micron wide mirror 15 translates to a voltage increase of over fifty times. With the present design, because the double flexure 532, 534 is not part of the mirror 15, the thickness and width of the flexures 532, 534 can be reduced to counter balance the effect of shortening L.

It should be noted that other variations of the present invention are possible. For example, the unit mover assembly 226 can be performed by charging the element 15 through the flexures 532, 534 to create electrostatic force between the element 15 and the base 14.

Figure 6:
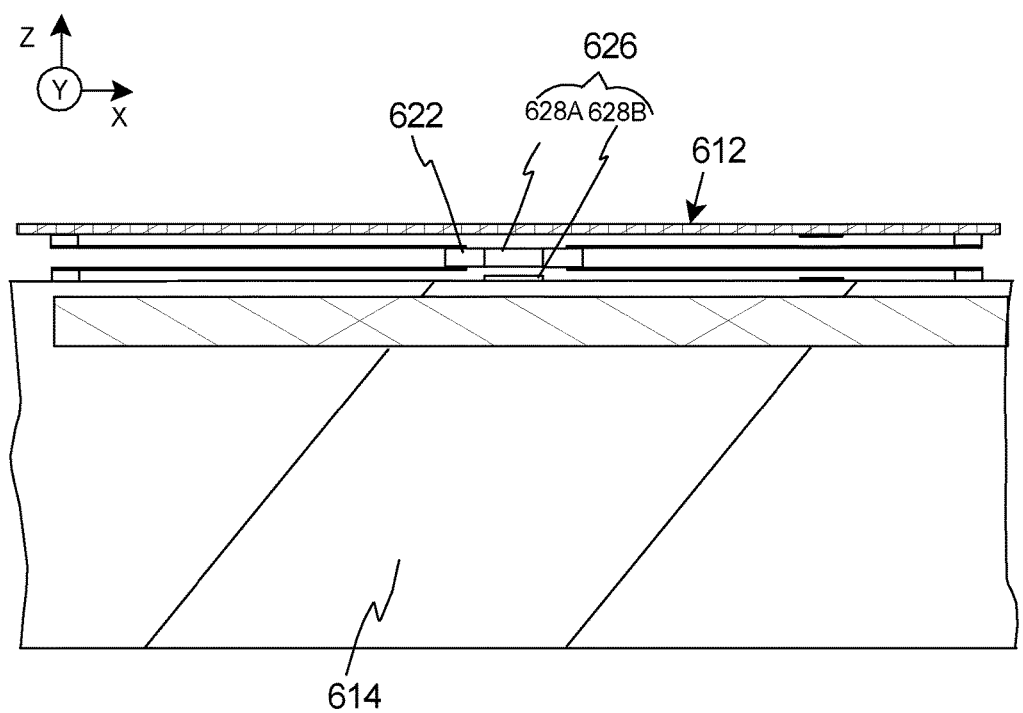
FIG. 6 is a simplified illustration of another embodiment of an element unit and a portion of the base.

Referring to FIG. 6, in another example, the mover assembly 626 can be centrally located on each element 612 with a single electrode pair that includes the first electrode 628A secured to the joiner 622, and the second electrode 628B secured to the base 614. With this design, the centrally located electrode 628A, 628B pair is used to move the element 612.

FIGS. 7A-7F are simplified illustrations of a non-exclusive example of one element unit 12 at various stages of manufacturing. More specifically, referring to FIG. 7A a first sacrificial layer (SiO$_2$, resist or other) can be deposited on the bottom of the optical element 15. Next, referring to FIG. 7B, bottom of the optical element 15 can be etched and the first connectors 532B can deposited on the bottom of the optical element 15. Subsequently, referring to FIG. 7C, the first beams 532A can be deposited on the respective first connectors 532B. Next, referring to FIG. 7D, the joiner 222 can be added to the first beams 532A. Subsequently, FIG. 7E illustrates the second flexure beams 534A have been added to the joiner 222. Next, FIG. 7F illustrates the second connectors 534B have been added to the second flexure beams 534A. At this stage, the unit mover assembly (not shown) can be added and the element unit 12 is ready to be attached to the base. All of the above steps in the processing of the MEMs device follow in accordance to semiconductor processing: the new feature is first defined by lithographic means using a photosensitive resist, the material is deposited or removed by etch methods and then followed by a post-clean up step were the resist is removed.

Figure 8A:
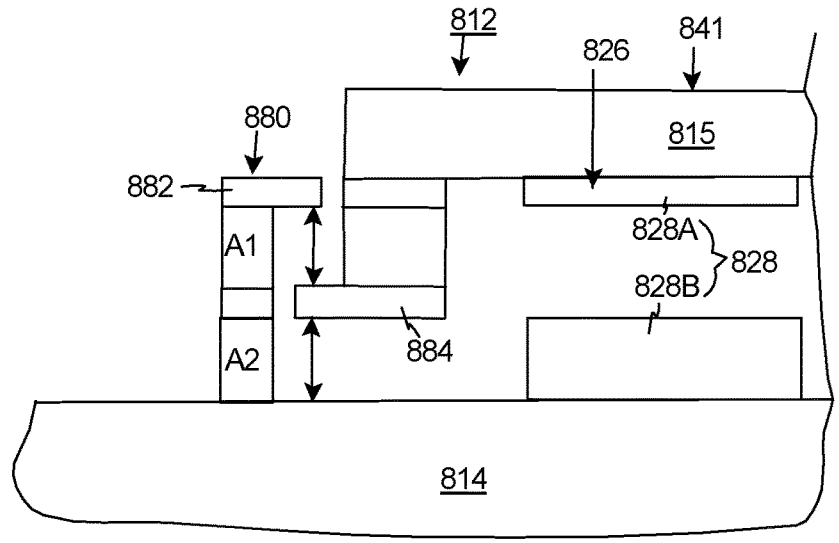
FIG. 8A, FIG. 8B, and FIG. 8C are simplified illustrations of a portion of another embodiment of the element unit and the base at three alternative positions.
Figure 8B:
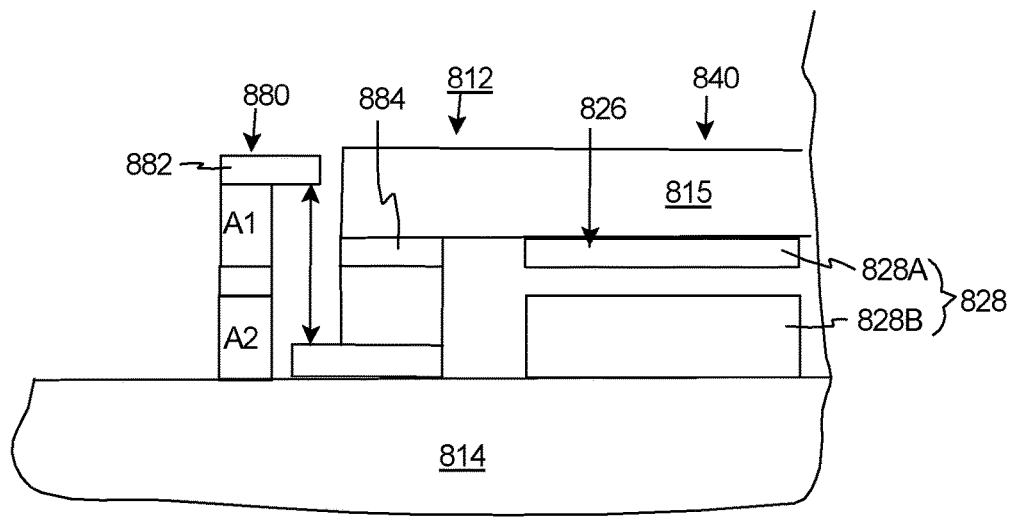
Figure 8C:
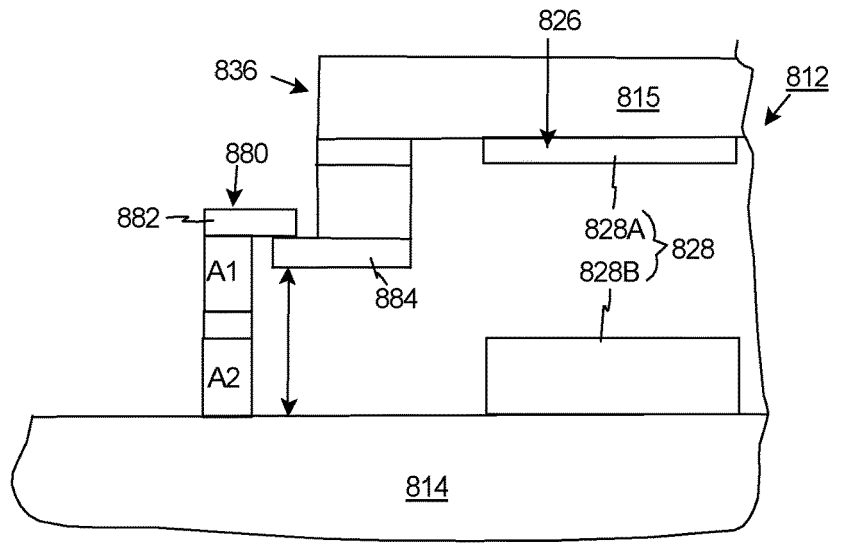

FIGS. 8A, 8B, and 8C are simplified illustrations of a portion of another embodiment of the element unit 812 and the base 814 in three alternative positions. It should be noted that one or more of the element units 12 in the array of FIG. 1 can have the design illustrated in FIGS. 8A-8C. In this embodiment, it should be noted that only a portion of the element 815 is shown, and the element connector assembly is not shown. The element connector assembly can be designed similar to any of the element connector assemblies 16, 316, 416 described above.

Further, a central position 841 (central position) of the element 815 is illustrated in FIG. 8A, the second position 840 (bottom position) of the element 815 is illustrated in FIG. 8B, and the first position 836 (top position) of the element 815 is illustrated in FIG. 8C.

The unit mover assembly 826 can be controlled to selectively to move the element 815 between the positions 836, 840, 841. Only one of the movers 828 including the first and second electrodes 828A, 828B of the unit mover assembly 826 is shown in these FIGS. 8A-8C. However, the unit mover assembly 826 can include more than one mover 828.

Additionally, in one embodiment, the element unit 812 includes one or more stop assemblies 880 (only one is illustrated in FIGS. 8A-8C). For example, the element unit 812 can include three, four, or more stop assemblies 880. Further, the element unit 812 can include a stop assembly 880 positioned near each mover 826A.

In one embodiment, each stop assembly 880 includes an upper stop 882 that is secured to the base 814, and a lower stop 884 that is secured to the bottom of the element 815. Referring to FIGS. 8A-8C, the element 815 can be moved up and down in the vertical direction on the page. In this embodiment, the stroke is determined by the sum of the thicknesses of layers A1 and A2 of the stop assembly 880. With this design, when opposite charges are placed on the two electrodes 828A, 828B, the element 815 moves down until the lower stop 884 touches the base 814 when the element 815 is in the second position 840. Alternatively, when repelling charges are applied to the electrodes 828A, 828B, the element 815 moves up until the lower stop 884 engages the upper stop 882 when the element 815 is in the first position 836. Further, when no charge is placed on the two electrodes 828A, 828B, the element 815 remains the center position 841.

In this embodiment, the element 815 can be positioned at three alternative positions 836, 840, 841, instead of the two positions of the previous embodiments. With the design illustrated in FIGS. 8A-8C, the element unit 812 includes the first stop 882 that inhibits further movement of the element 815 in a first direction when the element 815 is at the first position 836, and the spaced apart second stop 884 that inhibits further movement of the element 815 in a second direction when the element 815 is at the second position 840.

Figure 8D:
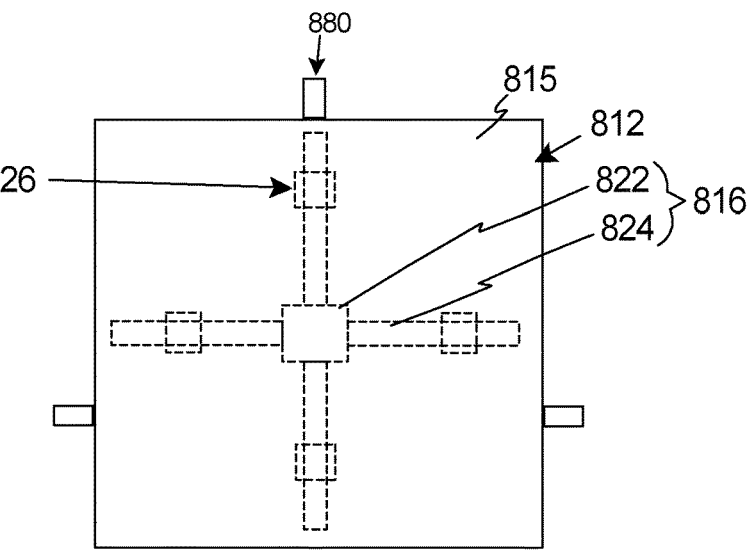
FIG. 8D is a top simplified illustration of the element unit of FIGS. 8A, 8B, 8C.

FIG. 8D is a simplified top illustration of the element unit 812 of FIGS. 8A-8C. FIG. 8D illustrates the optical element 815, the unit mover assembly 826, and the element connector assembly 816 including the joiner 822 and the flexure assemblies 824.

In this embodiment, the element unit 812 includes three spaced apart stop assemblies 880. With this design, by placing three or more of these stop assemblies 880 on each element 815, the element 815 can be accurately positioned alternatively at the first and second positions 836, 840. In certain embodiments, three stop assemblies 880 can be used for each element unit 812 to provide kinematic and repeatable positioning. Stated in another fashion, this embodiment provides a positive hard-stop for actuation in both directions (first and second positions 836, 840).

Figure 8E:
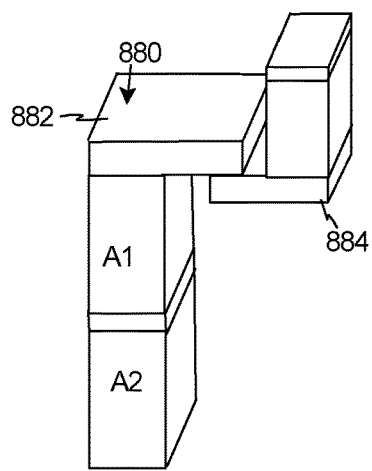
FIG. 8E is a perspective view of a stop assembly having features of the present invention.

FIG. 8E is a perspective view of one non-exclusive example of a stop assembly 880 including the lower stop 884 and the upper stop 882 from FIGS. 8A-8D. In this embodiment, the lower stop 884 has a generally "L" shaped configuration, while the upper stop 882 has a generally inverted "L" shaped configuration.

FIG. 9A, FIG. 9B, FIG. 9C, FIG. 9D, and FIG. 9E are simplified illustrations of a portion of another embodiment of the element unit 912 and the base 914 at five alternative positions. It should be noted that one or more of the element units 12 in the array of FIG. 1 can have the design illustrated in FIGS. 9A-9E. In this embodiment, it should be noted that only a portion of the element 915 is shown, and the element connector assembly is not shown. The element connector assembly can be designed similar to any of the element connector assemblies 16, 316, 416 described above.

Figure 9A:
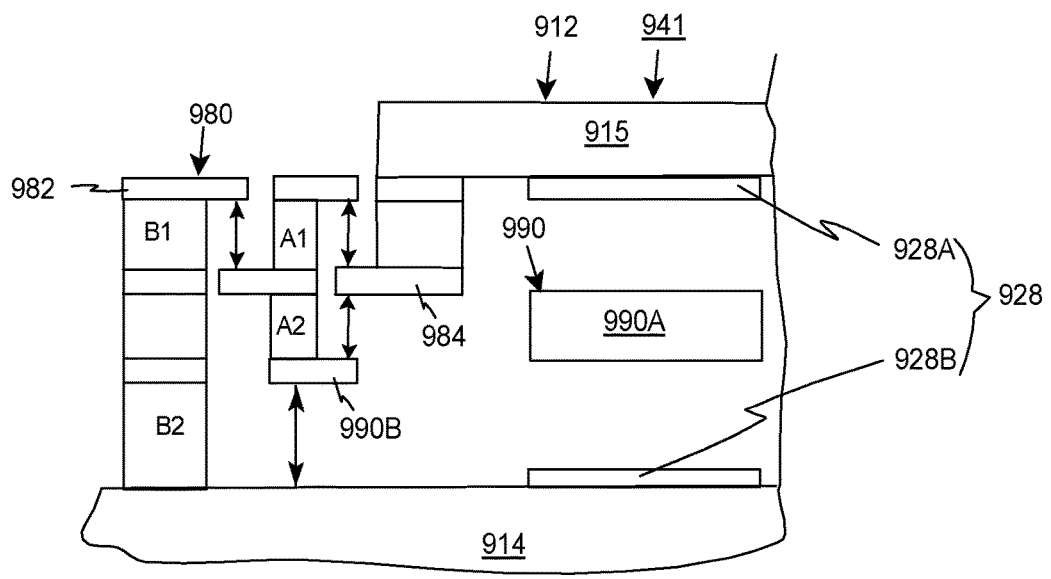
FIG. 9A, FIG. 9B, FIG. 9C, FIG. 9D, and FIG. 9E are simplified illustrations of a portion of another embodiment of the element unit and the base at five alternative positions.
Figure 9B:
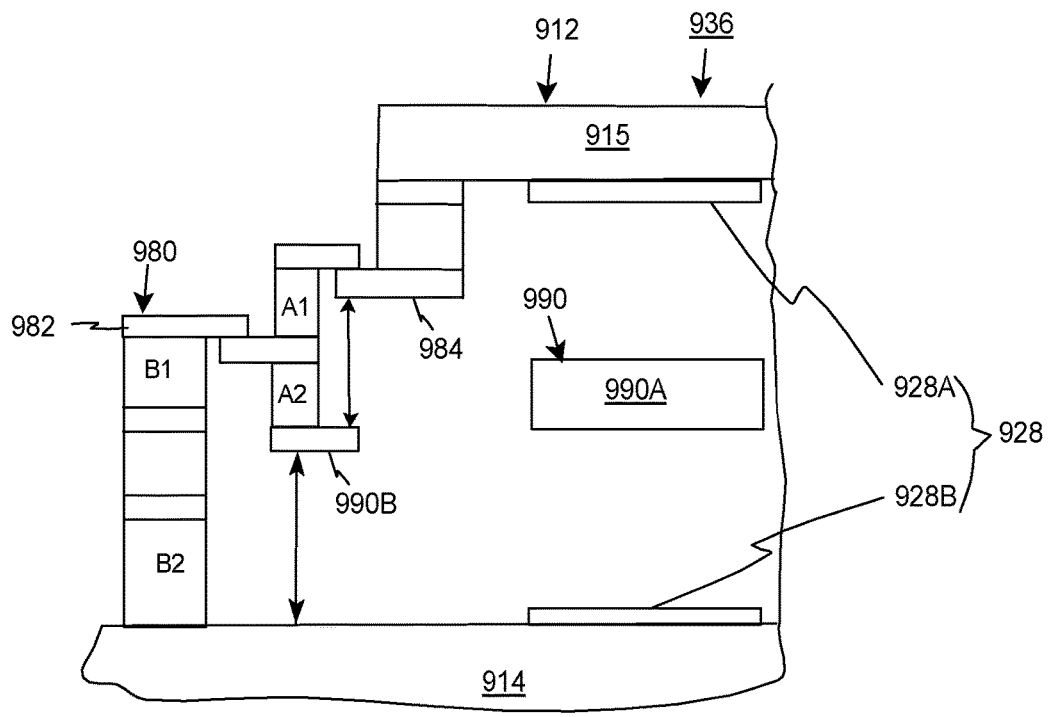
Figure 9C:
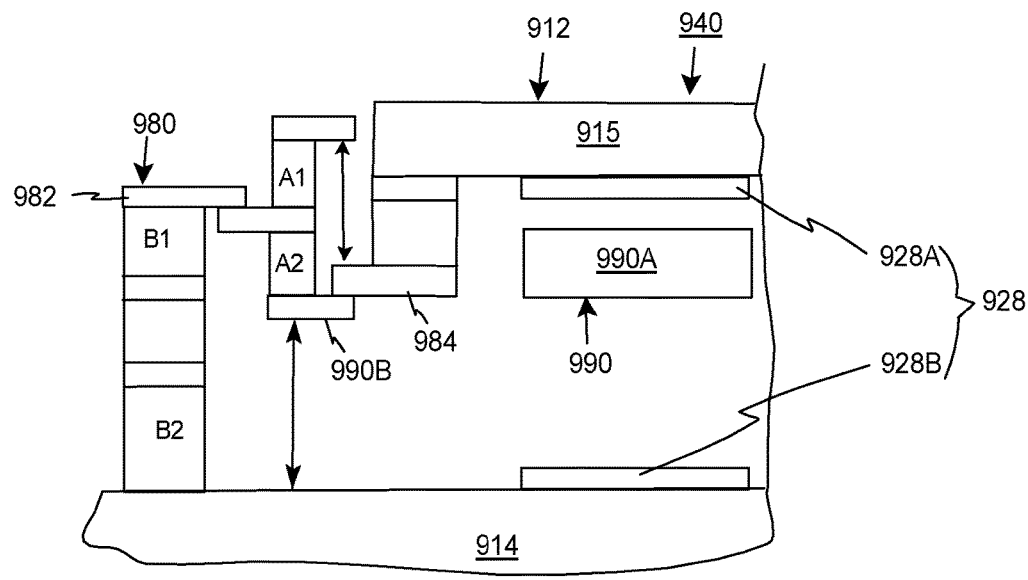
Figure 9D:
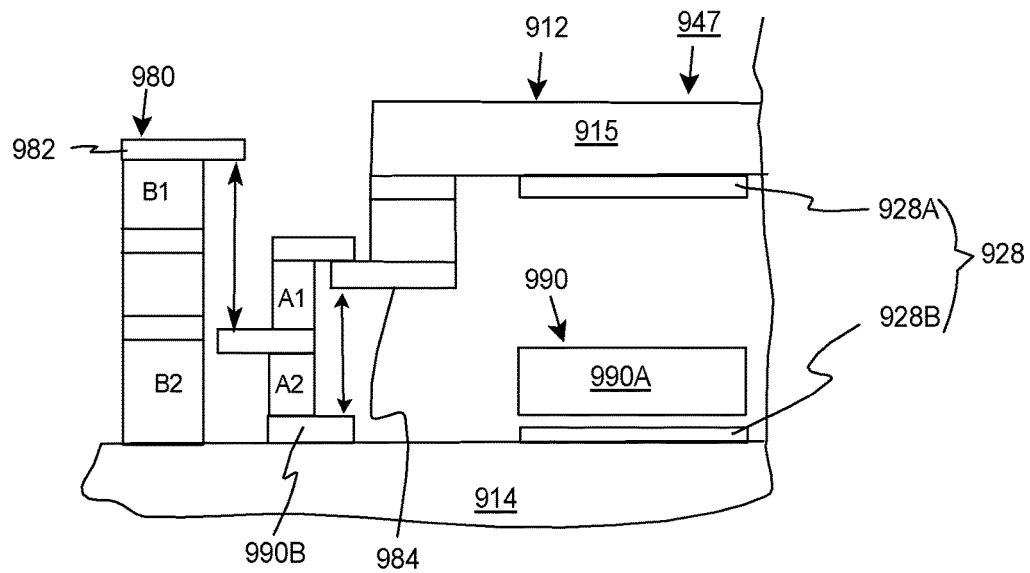
Figure 9E:
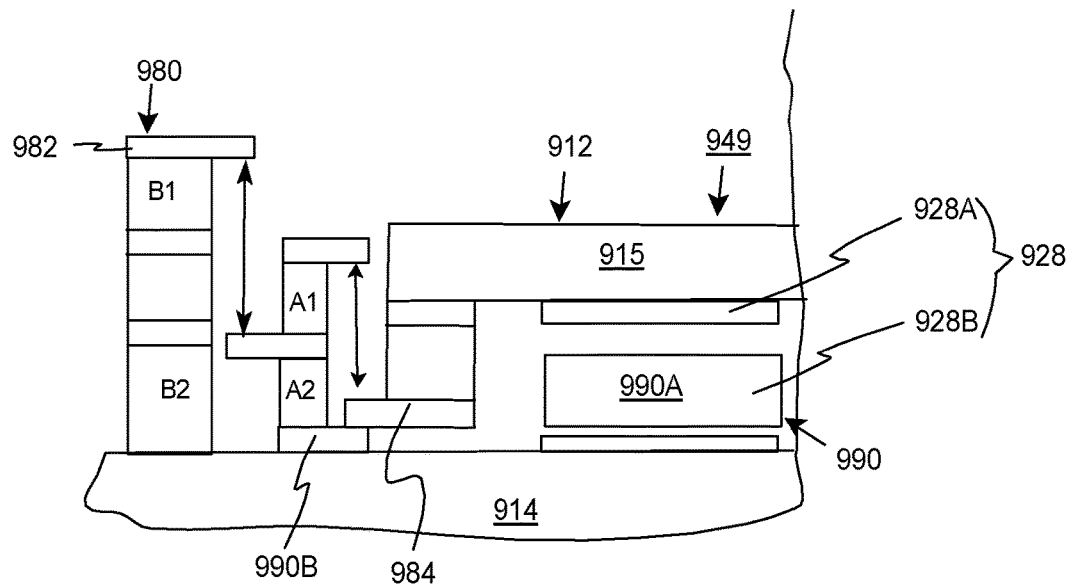

In this embodiment, a central position 941 (central position) of the element 915 is illustrated in FIG. 9A; the first position 936 (upper position) of the element 915 is illustrated in FIG. 9B; the second position 940 (second highest position) of the element 915 is illustrated in FIG. 9C; the third position 947 (third highest position) of the element 915 is illustrated in FIG. 9D; and the fourth position 949 (lowest position) of the element 915 is illustrated in FIG. 9E.

Only one of the movers 928 including the first and second electrodes 928A, 928B is shown. Moreover, in this embodiment, each element unit 912 includes one or more stop assemblies 980 (only one is illustrated in FIG. 9A). In one embodiment, each stop assembly 980 includes an upper stop 982 that is secured to the base 914, and a lower stop 984 that is secured to the bottom of the element 915.

Additionally, the element unit 912 includes an intermediate moving structure 990 that includes (i) an intermediate electrode 990A positioned between the electrodes 928A, 928B; and (ii) an intermediate stop 990B that extends between the stops 982, 984. Further the intermediate electrode 990A and the intermediate stop 990B are coupled together and move concurrently together. With this design, when the electrodes 928A, 928B, 990A are charged, both the intermediate moving structure 990 and the element unit 912 move. Stated in another fashion, with this design, the electrodes 990A, 928A, 928B can be controlled to position the element 915 and the intermediate moving structure 990.

With the design, as illustrated in FIG. 9A, there are now four possible heights (optical phases) for the mirror 915, assuming the two strokes A1+A2 and B1+B2 are unequal. In one preferred embodiment, B1+B2=2*□/3 optical radians and A1+A2=□□/3 optical radians.

Figure 9F:
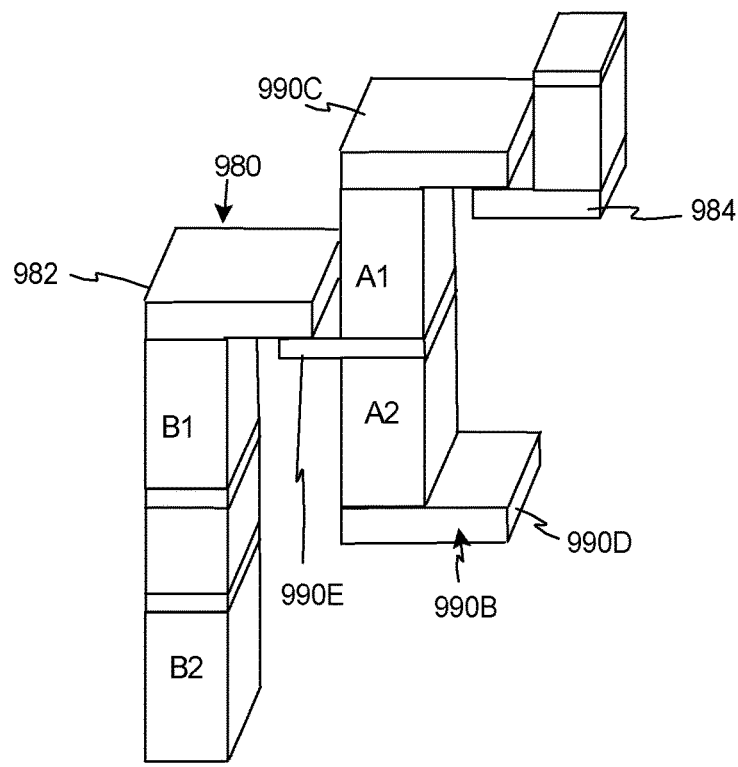
FIG. 9F is a perspective view of a stop assembly having features of the present invention.

FIG. 9F is a perspective view of one non-exclusive example of a stop assembly 980 including the lower stop 984, the upper stop 982, and the intermediate stop 990B from FIGS. 9A-9E. In this embodiment, (i) the lower stop 984 has a generally "L" shaped configuration, (ii) the upper stop 982 has a generally inverted "L" shaped configuration with a first section having a height of "B1" and a second section having a height of "B2", and (iii) the intermediate stop 990B is shaped somewhat similar to a sideways, small square "Y" with a top stop 990C and a bottom stop 990D that can engage the lower stop 984, and a middle stop 990E that can engage the upper stop 982. In this embodiment, the intermediate stop 990B has a section having a height of "A1" and another section having a height of "A2".

FIG. 9G is a table that illustrates the control of the element unit 912 of FIGS. 9A-9E. When the electrodes 928A, 928B, 990A are energized as shown in the table of FIG. 9B, the optical phase can be controlled to four equally spaced values.

It should be noted that the element unit can be designed to have more stops than illustrated in FIGS. 9A-9F. For example, the element unit can be designed with multiple intermediate stops to have six stops for a six position mirror or eight stops eight stops for an eight position mirror. Further, the element unit can be designed so that the stops are positioned entirely under the respective mirror so that adjacent element units can be positioned in close proximity to each other.

Figure 10:
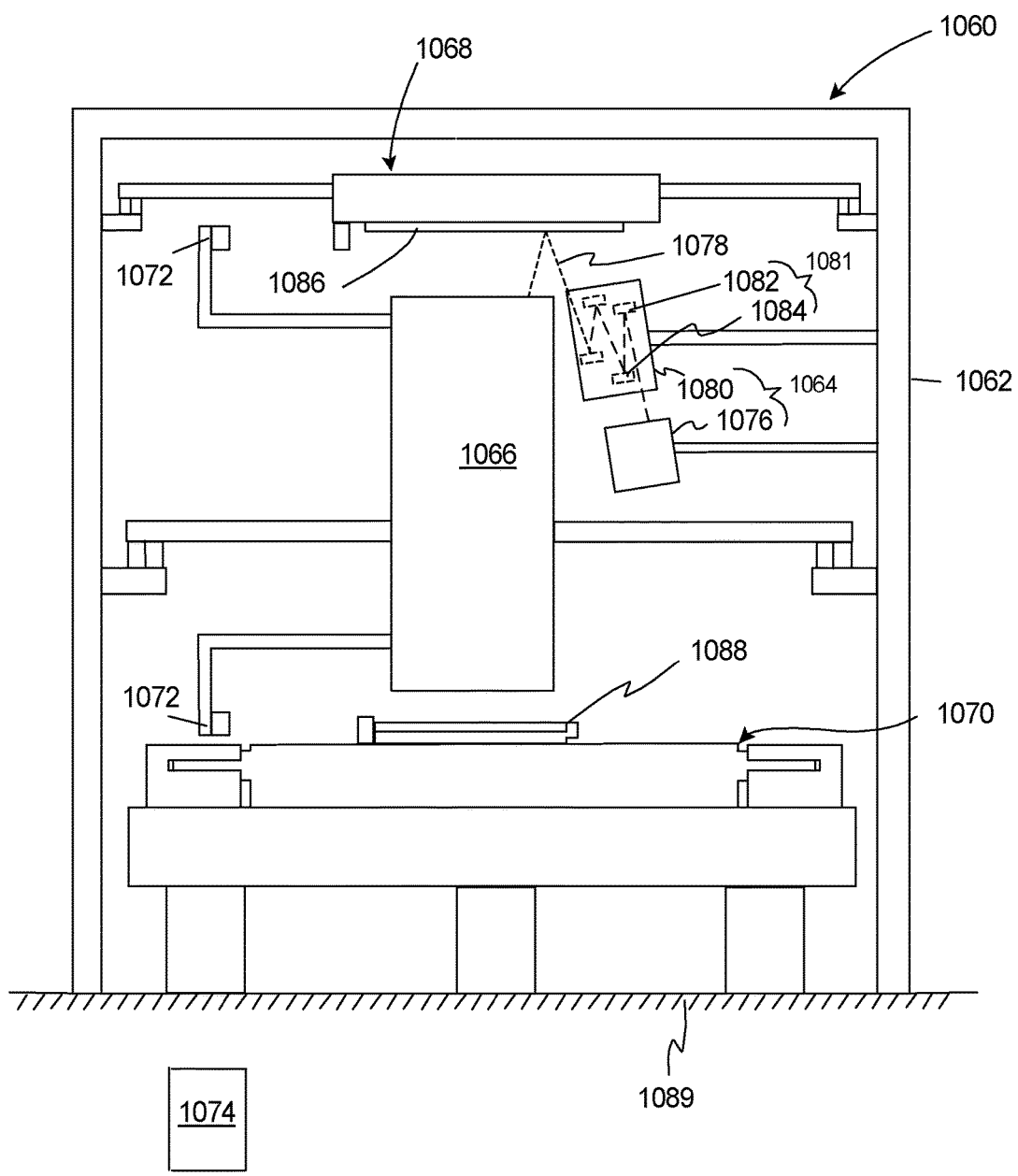
FIG. 10 is a schematic view of a lithography system having features of the present invention.

FIG. 10 is a schematic illustration of a precision assembly, namely an exposure apparatus 1060 (also referred to as a lithography apparatus) having features of the present invention. The exposure apparatus 1060 includes an apparatus frame 1062, an illumination system 1064 (irradiation apparatus), an output optical assembly 1066, a reticle stage assembly 1068, a wafer stage assembly 1070, a measurement system 1072, and a control system 1074. The design of the components of the exposure apparatus 1060 can be varied to suit the design requirements of the exposure apparatus 1060.

As an overview, in certain embodiments, the illumination system 1064 includes an illumination source 1076 that generates an illumination beam 1078 (illustrated with dashed lines), and an illumination optical assembly 1080 that includes a light adjuster 1081 (sometimes referred to as an "adaptive mirror assembly") having a first mirror assembly 1082 (illustrated in phantom) and a second mirror assembly 1084 (illustrated in phantom) that are uniquely designed to enable for precise adjustments and changes in the illumination conditions without masking of the illumination beam 1078.

The exposure apparatus 1060 is particularly useful as a lithographic device that transfers a pattern (not shown) of an integrated circuit from a reticle 1086 onto a semiconductor wafer 1088. The exposure apparatus 1060 mounts to a mounting base 1089, e.g., the ground, a base, or floor or some other supporting structure.

There are a number of different types of lithographic devices. For example, the exposure apparatus 1060 can be used as a scanning type photolithography system that exposes the pattern from the reticle 1086 onto the wafer 1088 with the reticle 1086 and the wafer 1088 moving synchronously. In a scanning type lithographic device, the reticle 1086 is moved perpendicularly to an optical axis of the optical assembly 1066 by the reticle stage assembly 1068 and the wafer 1088 is moved perpendicularly to the optical axis of the optical assembly 1066 by the wafer stage assembly 1070. Scanning of the reticle 1086 and the wafer 1088 occurs while the reticle 1086 and the wafer 1088 are moving synchronously.

Alternatively, the exposure apparatus 1060 can be a step-and-repeat type photolithography system that exposes the reticle 1086 while the reticle 1086 and the wafer 1088 are stationary. In the step and repeat process, the wafer 1088 is in a constant position relative to the reticle 1086 and the optical assembly 1066 during the exposure of an individual field. Subsequently, between consecutive exposure steps, the wafer 1088 is consecutively moved with the wafer stage assembly 1070 perpendicularly to the optical axis of the optical assembly 1066 so that the next field of the wafer 1088 is brought into position relative to the optical assembly 1066 and the reticle 1086 for exposure. Following this process, the images on the reticle 1086 are sequentially exposed onto the fields of the wafer 1088, and then the next field of the wafer 1088 is brought into position relative to the optical assembly 1066 and the reticle 1086.

However, the use of the exposure apparatus 1060 provided herein is not limited to a photolithography system for semiconductor manufacturing. The exposure apparatus 1060, for example, can be used as an liquid crystal display ("LCD") photolithography system that exposes a liquid crystal display device pattern onto a rectangular glass plate or a photolithography system for manufacturing a thin film magnetic head.

The reticle 1086 can be a reflective type as illustrated in FIG. 10 or a transmissive type. However, in FIG. 10, the reticle 1086 is reflective. The pattern in the reticle 1086 that is to be transferred to the wafer 1088 is defined by the local regions of the reticle 1086 where the reflectivity at the illumination radiation wavelengths of the reticle surface has been reduced to a very small value, thereby providing maximum image contrast at the wafer 1088.

The wafer 1088 includes a substrate that is covered with a photoresist. The photoresist can be photosensitive to some wavelengths of radiation and not sensitive to other wavelengths of radiation. For example, the photoresist can be sensitive to extreme electromagnetic ultraviolet radiation including wavelengths in the 10 to 15 nm range.

The apparatus frame 1062 is rigid and supports the components of the exposure apparatus 1060. The apparatus frame 1062 illustrated in FIG. 10 supports the reticle stage assembly 1068, the optical assembly 1066 and the illumination system 1064 above the mounting base 1089.

The illumination source 1076 emits the illumination beam 1078 (irradiation) of light energy. The illumination optical assembly 1080 guides the beam of light energy 1078 from the illumination source 1076 to the reticle 1086. The beam 1078 illuminates selectively different portions of the reticle 1086 and exposes the wafer 1088. In FIG. 10, the illumination source 1076 is illustrated as being supported by the apparatus frame 1062.

Radiation reflected from the reticle 1086 is collected by the optical assembly 1066 and focused on the semiconductor wafer 1088 to expose the photosensitive resist. The fraction of radiation reflected depends on both the intrinsic reflectivity of the reticle surface and the fraction of the surface occupied by the pattern.

In one embodiment, the illumination source 1076 generates an extreme ultraviolet (EUV) illumination beam 1078, including illumination wavelengths of between approximately 10-15 nm and typically illumination wavelengths in the 11 to 13 nm range, also referred to as the soft X-ray region. In this design, the illumination source 1076 can be a synchrotron radiation source or laser plasma source. Alternatively, for example, the illumination source 1076 can be a gas discharge source.

The illumination optical assembly 1080 is described in more detail below.

The output optical assembly 1066 collects and focuses the illumination beam 1088 that is reflected from the reticle 1086 to the wafer 1088. For an EUV illumination source 1076, the optical assembly 1066 is an all reflective system that includes one or more mirrors (not shown) that collect and focus the illumination beam 1078. The number of mirrors and the arrangement of the mirrors can be varied to suit the requirements of the optical assembly 1066. As alternative, non-exclusive examples, the illumination source 1076 generates a deep ultraviolet (DUV) illumination beam, including illumination wavelengths bellow 250 nm and typically illumination wavelengths in the 248 nm or 193 nm. As alternative, non-exclusive examples, the optical assembly 1066 is an all refractive system that includes one or more lenses that collect and focus the illumination beam, or reflective-refractive system that includes one or more mirrors and one or more lenses.

The reticle stage assembly 1068 holds and positions the reticle 1086 relative to the output optical assembly 1066 and the wafer 1088. Somewhat similarly, the wafer stage assembly 1070 holds and positions the wafer 1088 with respect to the projected image of the illuminated portions of the reticle 1086.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically transferred to the floor (ground) by use of a frame member as described in U.S. Pat. No. 5,528,100 and published Japanese Patent Application Disclosure No. 8-136475. Additionally, reaction forces generated by the reticle (mask) stage motion can be mechanically transferred to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,100 and 5,874,820 and Japanese Patent Application Disclosure No. 8-330224 are incorporated herein by reference.

The measurement system 1072 monitors movement of the reticle 1086 and the wafer 1088 relative to the optical assembly 1066 or some other reference. With this information, the control system 1074 can control the reticle stage assembly 1068 to precisely position the reticle 1086 and the wafer stage assembly 1070 to precisely position the wafer 1088. For example, the measurement system 1072 can utilize multiple laser interferometers, encoders, and/or other measuring devices.

The control system 1074 is connected to the reticle stage assembly 1068, the wafer stage assembly 1070, and the measurement system 1072. The control system 1074 receives information from the measurement system 1072 and controls the stage mover assemblies 1068, 1070 to precisely position the reticle 1086 and the wafer 1088.

Additionally, the control system 1074 can control the operation of the light adjuster 1081 to precisely adjust the characteristics of the illumination beam 1078 that is directed onto the reticle 1086. The control system 1074 can include one or more processors and circuits.

A photolithography system (an exposure apparatus) according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

It should be noted that for an EUV system, that the illumination beam 1078 should travel in a vacuum. For example, the illumination source 1076, the illumination optical assembly 1080, the reticle stage assembly 1068, the output optical assembly 1066, and the wafer stage assembly 1070 can be positioned within a vacuum chamber (not shown).

Figure 11:
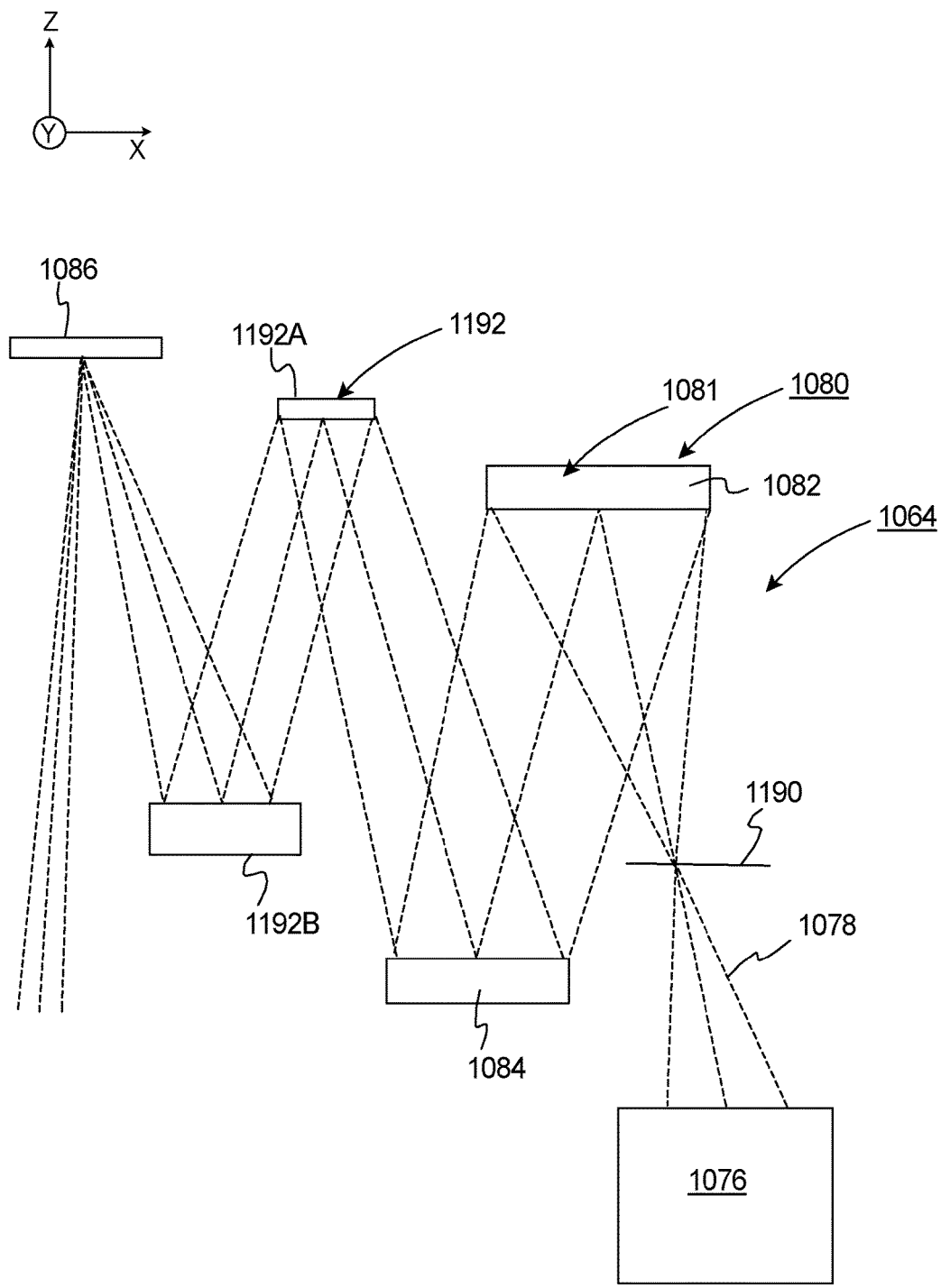
FIG. 11 is a simplified illustration of an illumination system having features of the present invention and a reticle.

FIG. 11 is a simplified illustration of the illumination system 1064 and the reticle 1086. In this embodiment, the illumination system 1064 includes the illumination source 1076 that generates the illumination beam 1078, and the illumination optical assembly 1080 that directs the illumination beam 1078 at the reticle 1086. Further, in this embodiment, the illumination optical assembly 1080 includes a focus plate 1190, one or more condenser elements 1192 (illustrated as boxes), and the light adjuster 1081. The design and positioning of each of these components can be varied pursuant to the teachings provided herein.

The focus plate 1190 creates an intermediate focus point for the illumination beam 1078. In one non-exclusive embodiment, the focus plate 1190 is a generally flat plate that includes an aperture so that the illumination beam 1078 can pass therethrough.

The condenser elements 1192 direct and focus the illumination beam 1078 reflected off of the light adjuster 1194 onto the reticle 1086. In FIG. 11, the illumination optical assembly 1080 includes two condenser elements 1192, namely a first condenser element 1192A and a second condenser element 1192B. Alternatively, the illumination optical assembly 1080 can include more than two condenser elements 1192.

In one embodiment, each of the condenser elements 1192 is a mirror that includes a front surface and an opposed rear surface. The front surface defines a figure that is curved so that the light rays that strike the front surface converge or diverge. The front surface is coated with multiple thin layers of material that collectively create a fairly reflective surface at the wavelength of the illumination beam 1078. The type of material utilized for the layers of reflective material will depend upon the wavelength of the radiation generated by the illumination source 1076. For example, suitable layers include molybdenum/silicon for wavelengths of approximately 13 nm and molybdenum/beryllium for wavelengths of approximately 11 nm. However, other materials may be utilized.

The light adjuster 1081 includes the first mirror assembly 1082 (illustrated as a box) and the second mirror assembly 1084 (illustrated in box) that are uniquely designed to enable for adjustments and changes in the illumination conditions of the illumination beam 1078 without or with only minimal reduction of the illumination beam 1078. It should be noted that the optical element assembly 10 illustrated in FIG. 1 can be used as one or both of the mirror assemblies 1082, 1084. Further, the mirror assemblies 1082, 1084 can be referred to as fly-eye optical systems.

In FIG. 11, the illumination beam 1078 is directed from the illumination source 1076, through the focus plate 1190 and at the first mirror assembly 1082. Further, light reflected off of the first mirror assembly 1082 is directed at the second mirror assembly 1084. Subsequently, light reflected off of the second mirror assembly 1084 is directed at the first condenser element 1192A. Next, light reflected off of the first condenser element 1192A is directed at the second condenser element 1192B. Finally, light reflected off of the second condenser element 1192B is directed at the reticle 1086.

Figure 12A:
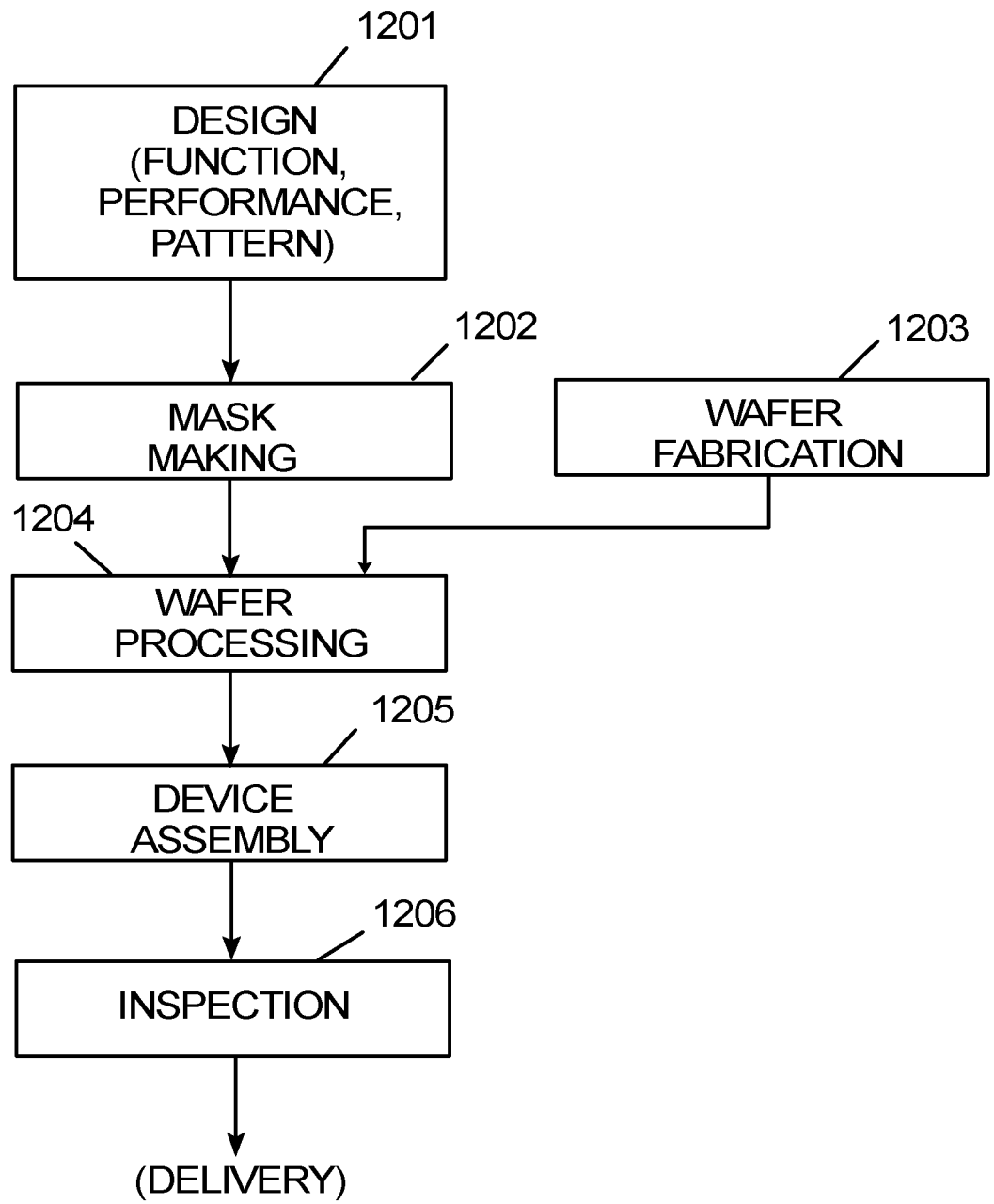
FIG. 12A is a flow chart that outlines a process for manufacturing a device in accordance with the present invention.

Semiconductor devices can be fabricated using the above described systems, by the process shown generally in FIG. 12A. In step 1201 the device's function and performance characteristics are designed. Next, in step 1202, a mask (reticle) having a pattern is designed according to the previous designing step, and in a parallel step 1203 a wafer is made from a silicon material. The mask pattern designed in step 1202 is exposed onto the wafer from step 1203 in step 1204 by a photolithography system described hereinabove in accordance with the present invention. In step 1205, the semiconductor device is assembled (including the dicing process, bonding process and packaging process), finally, the device is then inspected in step 1206.

Figure 12B:
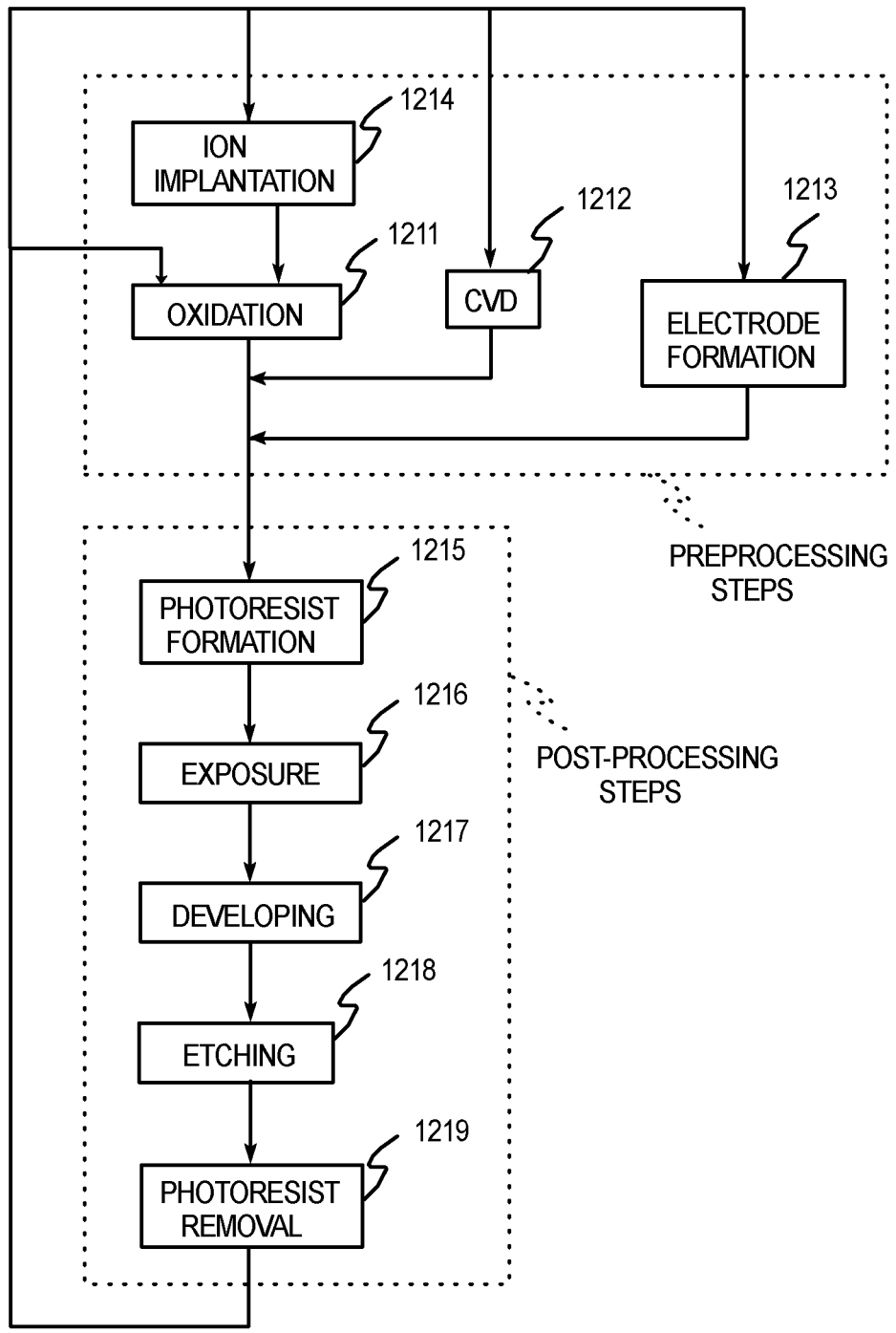
FIG. 12B is a flow chart that outlines device processing in more detail.

FIG. 12B illustrates a detailed flowchart example of the above-mentioned step 1204 in the case of fabricating semiconductor devices. In FIG. 12B, in step 1211 (oxidation step), the wafer surface is oxidized. In step 1212 (CVD step), an insulation film is formed on the wafer surface. In step 1213 (electrode formation step), electrodes are formed on the wafer by vapor deposition. In step 1214 (ion implantation step), ions are implanted in the wafer. The above mentioned steps 1211-1214 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 1215 (photoresist formation step), photoresist is applied to a wafer. Next, in step 1216 (exposure step), the above-mentioned exposure device is used to transfer the circuit pattern of a mask (reticle) to a wafer. Then in step 1217 (developing step), the exposed wafer is developed, and in step 1218 (etching step), parts other than residual photoresist (exposed material surface) are removed by etching. In step 1219 (photoresist removal step), unnecessary photoresist remaining after etching is removed. Multiple circuit patterns are formed by repetition of these preprocessing and post-processing steps.

At each stage of wafer processing, when the above-mentioned preprocessing steps have been completed, the following post-processing steps are implemented. During post-processing, first, in step 1215 (photoresist formation step), photoresist is applied to a wafer. Next, in step 1216 (exposure step), the above-mentioned exposure device is used to transfer the circuit pattern of a mask (reticle) to a wafer. Then in step 1217 (developing step), the exposed wafer is developed, and in step 1218 (etching step), parts other than residual photoresist (exposed material surface) are removed by etching. In step 1219 (photoresist removal step), unnecessary photoresist remaining after etching is removed. Multiple circuit patterns are formed by repetition of these preprocessing and post-processing steps.

At each stage of wafer processing, when the above-mentioned preprocessing steps have been completed, the following post-processing steps are implemented. During post-processing, first, in step 1215 (photoresist formation step), photoresist is applied to a wafer. Next, in step 1216 (exposure step), the above-mentioned exposure device is used to transfer the circuit pattern of a mask (reticle) to a wafer. Then in step 1217 (developing step), the exposed wafer is developed, and in step 1218 (etching step), parts other than residual photoresist (exposed material surface) are removed by etching. In step 1219 (photoresist removal step), unnecessary photoresist remaining after etching is removed. Multiple circuit patterns are formed by repetition of these preprocessing and post-processing steps.

While the method and system as shown and disclosed herein is fully capable of obtaining the objects and providing the advantages herein before stated, it is to be understood that it is merely illustrative of the presently preferred embodiments of the invention and that no limitations are intended to the details of construction or design herein shown.

What is claimed is:

1. An optical element assembly for adjusting the characteristics of a beam, the optical element assembly comprising:
   a base;
   an optical element which the beam is incident thereon, the optical element including an element central axis;
   a mover which moves the optical element in a move direction which crosses to a surface of the base;
   a first flexure which is arranged between the optical element and the base, the first flexure extending in a first direction which crosses to the move direction, the first flexure having a first end which is connected to the optical element at a first position which is away from the element central axis of the optical element, and a second end which is located at a second position that is nearer to the element central axis of the optical element than the first position; and
   a second flexure which is arranged between the optical element and the base, the second flexure extending in a second direction which crosses to the move direction, the second flexure having a third end which is connected to the optical element at a third position which is away from the element central axis of the optical element, and a fourth end which is located at a fourth position that is nearer to the element central axis of the optical element than the third position;
   wherein the first end and the second end of the first flexure move different distances than one another when the optical element is moved in the move direction; and
   wherein the third end and the fourth end of the second flexure move different distances than one another when the optical element is moved in the move direction.

2. The optical element assembly of claim 1, further comprising:
   a third flexure which is arranged between the first flexure and the base, the third flexure extending in the first direction, the third flexure having a fifth end which is connected to the second end of the first flexure, and a sixth end which is connected to the base; and
   a fourth flexure which is arranged between the second flexure and the base, the fourth flexure extending in the second direction, the fourth flexure having a seventh end which is connected to the fourth end of the second flexure, and an eighth end which is connected to the base.

3. The optical element assembly of claim 2, wherein the sixth end of the third flexure is located farther away from the element central axis than the fifth end, and wherein the eighth end of the fourth flexure is located farther away from the element central axis than the seventh end.

4. The optical element assembly of claim 3, further comprising:
   a connector which connects the second end of the first flexure and the fifth end of the third flexure, and which connects the fourth end of the second flexure and the seventh end of the fourth flexure.

5. The optical element assembly of claim 4, wherein the connector is located nearer to the element central axis of the optical element than the first position.

6. The optical element assembly of claim 3, wherein the sixth end of the third flexure is connected to the base at a third position that is aligned with the first position along a first axis that is parallel to the move direction, and the eighth end of the fourth flexure is connected to the base at a fourth position that is aligned with the second position along a second axis that is parallel to the move direction.

7. The optical element assembly of claim 6, further comprising:
   a first connector which is arranged between the sixth end of the third flexure and the base, and which connects the sixth end and the base; and
   a second connector which is arranged between the eighth end of the fourth flexure and the base, and which connects the eighth end and the base.

8. The optical element assembly of claim 1, further comprising:
   a first connector which is located at the first position, and which connects the first end and the optical element; and
   a second connector which is located at the second position, and which connects the third end and the optical element.

9. The optical element assembly of claim 1, wherein each of the first flexure and the second flexure extend from near the element central axis to near an outer perimeter of the optical element.

10. An exposure apparatus which exposes a workpiece with an exposure light, comprising:
    the optical element assembly of claim 1;
    an illumination optical system which illuminates the optical element of the optical element assembly with the exposure light;
    a projection optical system which leads the exposure light from the optical element assembly to the workpiece and which projects a pattern on the workpiece; and
    a controller configured to control a position of the optical element in the move direction.

11. A device manufacturing method comprising:
    forming a pattern of photosensitive layer on the workpiece using the exposure apparatus of claim 10; and
    processing the workpiece which has the pattern.

12. A method for adjusting the characteristics of a beam, the method comprising the steps of:
    providing a base;
    providing an optical element which the beam is incident thereon, the optical element including an element central axis;
    arranging a first flexure between the optical element and the base, the first flexure extending in a first direction which crosses to the move direction, the first flexure having a first end which is connected to the optical element at a first position which is away from the element central axis of the optical element, and a second end which is located at a second position that is nearer to the element central axis of the optical element than the first position;
    arranging a second flexure between the optical element and the base, the second flexure extending in a second direction which crosses to the move direction, the second flexure having a third end which is connected to the optical element at a third position which is away from the element central axis of the optical element, and a fourth end which is located at a fourth position that is nearer to the element central axis of the optical element than the third position; and moving the optical element in a move direction which crosses to a surface of the base with a mover; wherein the first end and the second end of the first flexure move different distances than one another when the optical element is moved in the move direction; and wherein the third end and the fourth end of the second flexure move different distances than one another when the optical element is moved in the move direction.

13. The method of claim 12, further comprising the steps of:

arranging a third flexure between the first flexure and the base, the third flexure extending in the first direction, the third flexure having a fifth end which is connected to the second end of the first flexure, and a sixth end which is connected to the base; and arranging a fourth flexure between the second flexure and the base, the fourth flexure extending in the second direction, the fourth flexure having a seventh end which is connected to the fourth end of the second flexure, and an eighth end which is connected to the base.

14. The method of claim 13, wherein the step of arranging a third flexure includes the third flexure being located farther away from the element central axis than the fifth end, and wherein the step of arranging the fourth flexure includes the eighth end of the fourth flexure being located farther away from the element central axis than the seventh end.

15. The method of claim 14, further comprising the steps of:

connecting the second end of the first flexure and the fifth end of the third flexure with a connector; and connecting the fourth end of the second flexure and the seventh end of the fourth flexure with the connector.

16. The method of claim 15, wherein the connector is located nearer to the element central axis of the optical element than the first position.

17. The method of claim 14, wherein the sixth end of the third flexure is connected to the base at a third position that is aligned with the first position along a first axis that is parallel to the move direction, and the eighth end of the fourth flexure is connected to the base at a fourth position that is aligned with the second position along a second axis that is parallel to the move direction.

18. The method of claim 17, further comprising the steps of:

connecting the sixth end of the third flexure and the base with a first connector that is arranged between the sixth end and the base; and connecting the eighth end of the fourth flexure and the base with a second connector that is arranged between the eighth end and the base.

19. The method of claim 12, further comprising the steps of:

connecting the first end of the first flexure and the optical element with a first connector that is located at the first position; and connecting the third end of the second flexure and the optical element with a second connector that is located at the second position.

20. The method of claim 12, wherein each of the first flexure and the second flexure extend from near the element central axis to near an outer perimeter of the optical element.

* * * * *